(12) United States Patent
Yoon et al.

(10) Patent No.: US 12,532,652 B2
(45) Date of Patent: Jan. 20, 2026

(54) METHOD FOR FABRICATING ELECTRODE BASED ON LIQUID METAL

(71) Applicant: KOREA UNIVERSITY RESEARCH AND BUSINESS FOUNDATION, Seoul (KR)

(72) Inventors: Hyo Jae Yoon, Seoul (KR); Seo Eun Byeon, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 680 days.

(21) Appl. No.: 17/795,154

(22) PCT Filed: Jul. 27, 2021

(86) PCT No.: PCT/KR2021/009737
§ 371 (c)(1),
(2) Date: Jul. 25, 2022

(87) PCT Pub. No.: WO2022/025596
PCT Pub. Date: Feb. 3, 2022

(65) Prior Publication Data
US 2023/0292582 A1    Sep. 14, 2023

(30) Foreign Application Priority Data

Jul. 28, 2020 (KR) .......................... 10-2020-0093806
Jul. 19, 2021 (KR) .......................... 10-2021-0094258

(51) Int. Cl.
*H10K 71/60* (2023.01)
*H10K 71/00* (2023.01)
*H10K 102/00* (2023.01)

(52) U.S. Cl.
CPC ......... *H10K 71/611* (2023.02); *H10K 71/621* (2023.02); *H10K 2102/00* (2023.02)

(58) Field of Classification Search
CPC . H10K 71/611; H10K 71/621; H10K 2102/00
See application file for complete search history.

(56) References Cited

U.S. PATENT DOCUMENTS 7,818,048 B2 * 10/2010 Plaza ................... A61B 5/6859
                                                      600/509
9,234,120 B2 *  1/2016 Wiessler .................... C09J 5/00
(Continued)

FOREIGN PATENT DOCUMENTS

KR  10-2013-0094957 A   8/2013
KR  10-2015-0136960 A  12/2015
(Continued)

OTHER PUBLICATIONS

International Search Report issued on Nov. 22, 2021 in counterpart International Patent Application No. PCT/KR2021/009737 (3 pages in English and 3 pages in Korean).

*Primary Examiner* — Dale E Page
*Assistant Examiner* — Quovaunda Jefferson
(74) *Attorney, Agent, or Firm* — NSIP Law

(57) ABSTRACT

The present invention relates to a liquid metal based fabrication method, and the method for fabricating an electrode based on a liquid metal, according to the present invention, comprises the steps of: preparing a first substrate having a self-assembled monolayer (SAM) on one surface thereof; and printing a liquid metal in a predetermined pattern to be in contact with the surface of the self-assembled monolayer by using a printing device including a needle from which the liquid metal is discharged, and a controller for controlling the movement of the needle, thereby forming a liquid metal electrode.

6 Claims, 38 Drawing Sheets

(56) References Cited

U.S. PATENT DOCUMENTS

2007/0138131 A1\* 6/2007 Burdinski ............ G03F 7/0002
                                                    216/41
2010/0148075 A1   6/2010 Chinn et al.

FOREIGN PATENT DOCUMENTS

| KR | 10-2019-0010409 A | 1/2019 |
| WO | WO 2013/094848 A1 | 6/2013 |
| WO | WO 2020/080664 A1 | 4/2020 |

\* cited by examiner

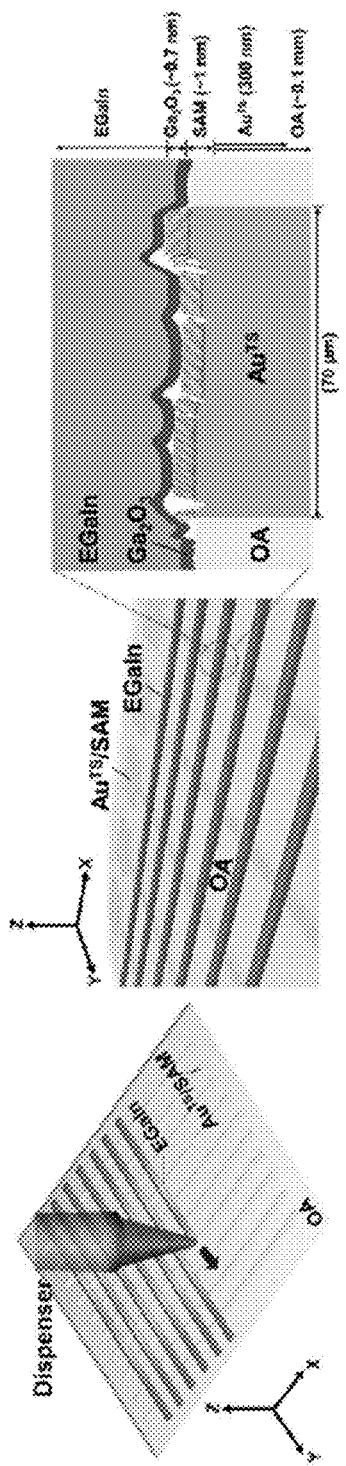
[Fig. 1a]

[Fig. 1b]
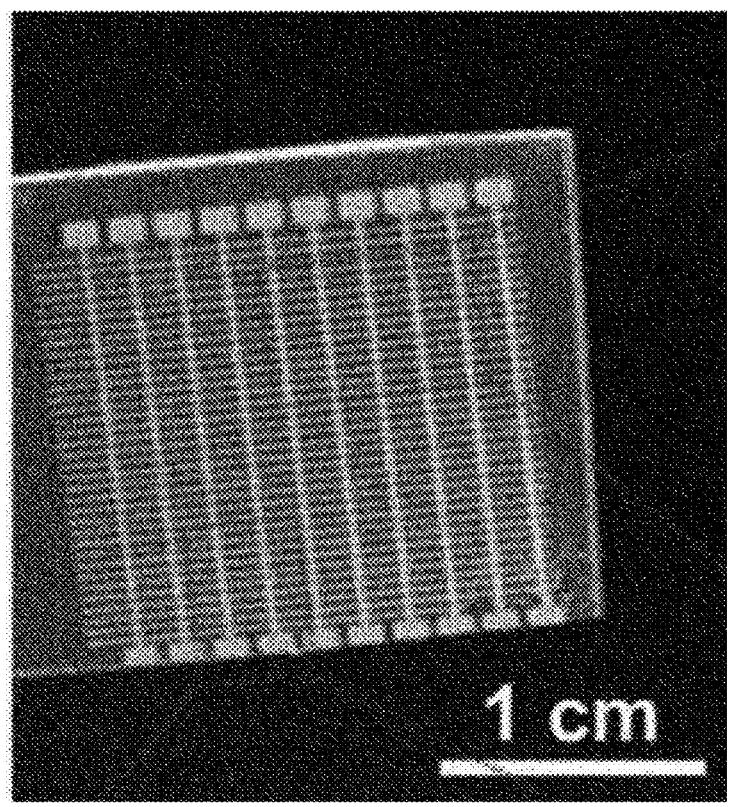

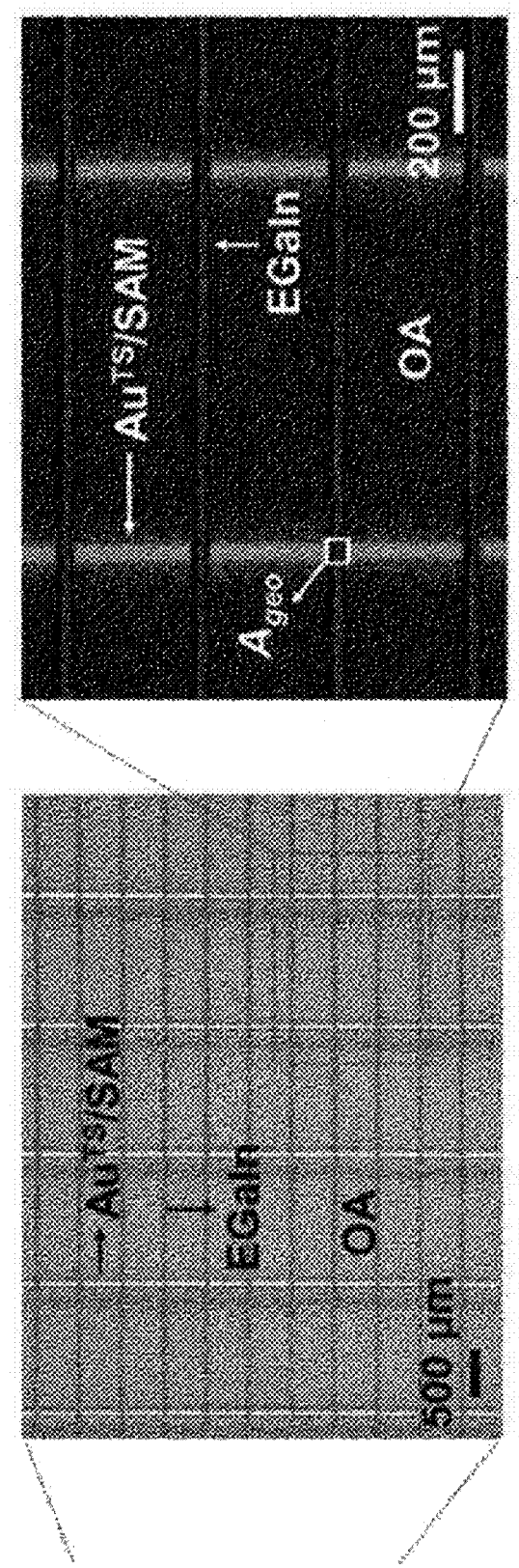
[Fig. 1c]

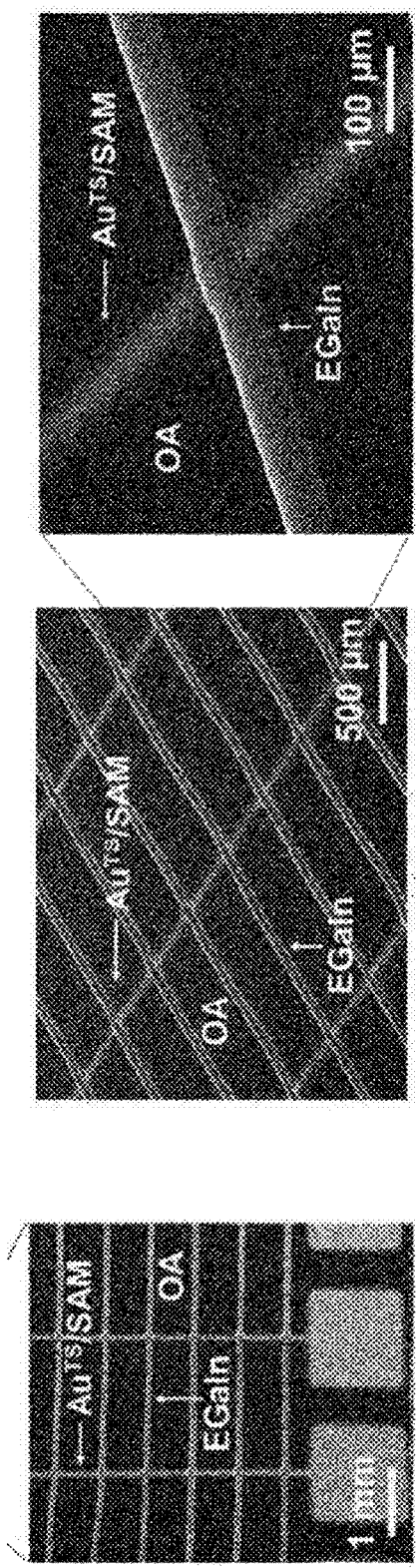
[Fig. 1d]

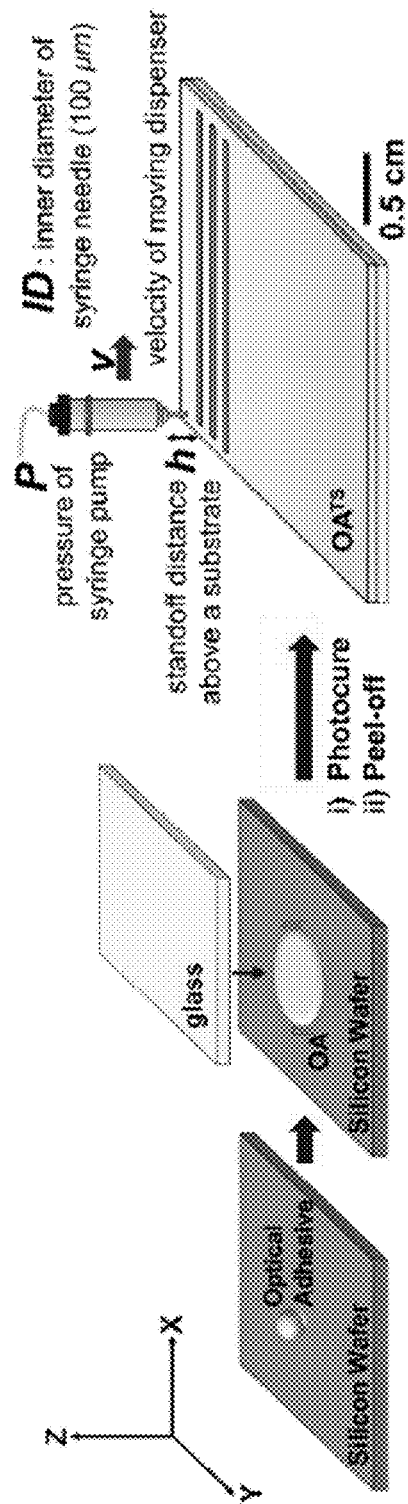
[Fig. 2a]

[Fig. 2b]
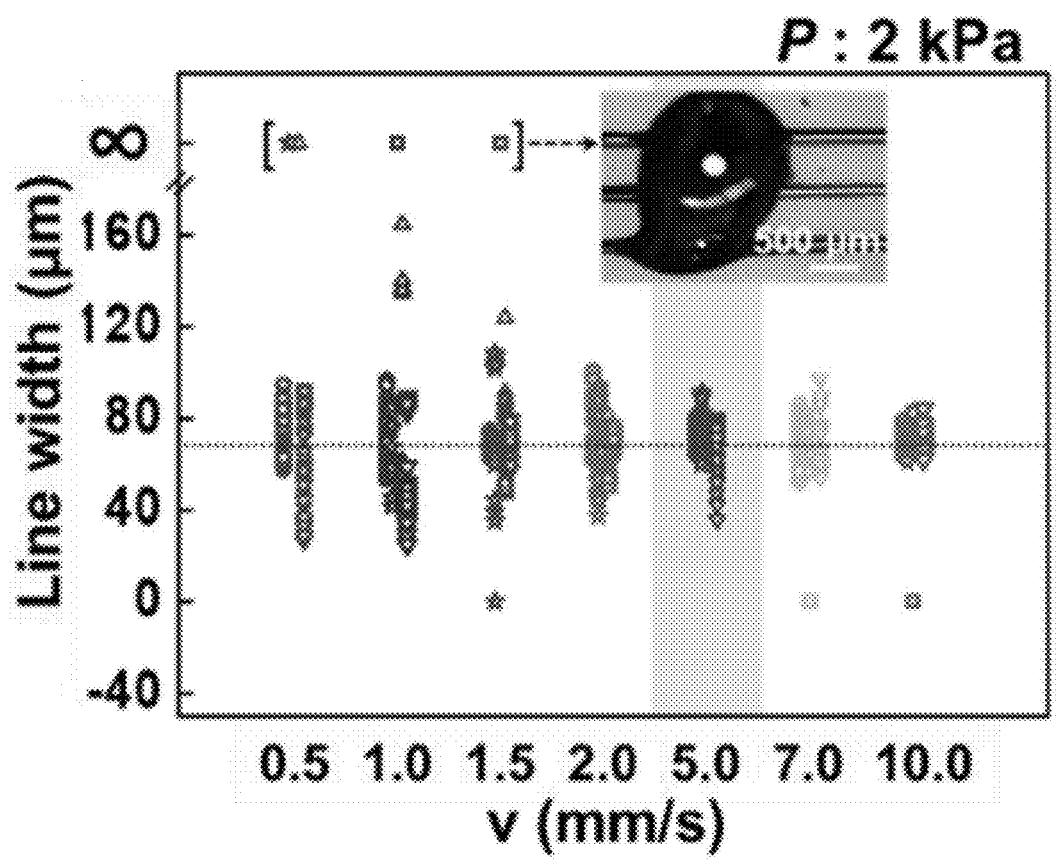

[Fig. 2c]
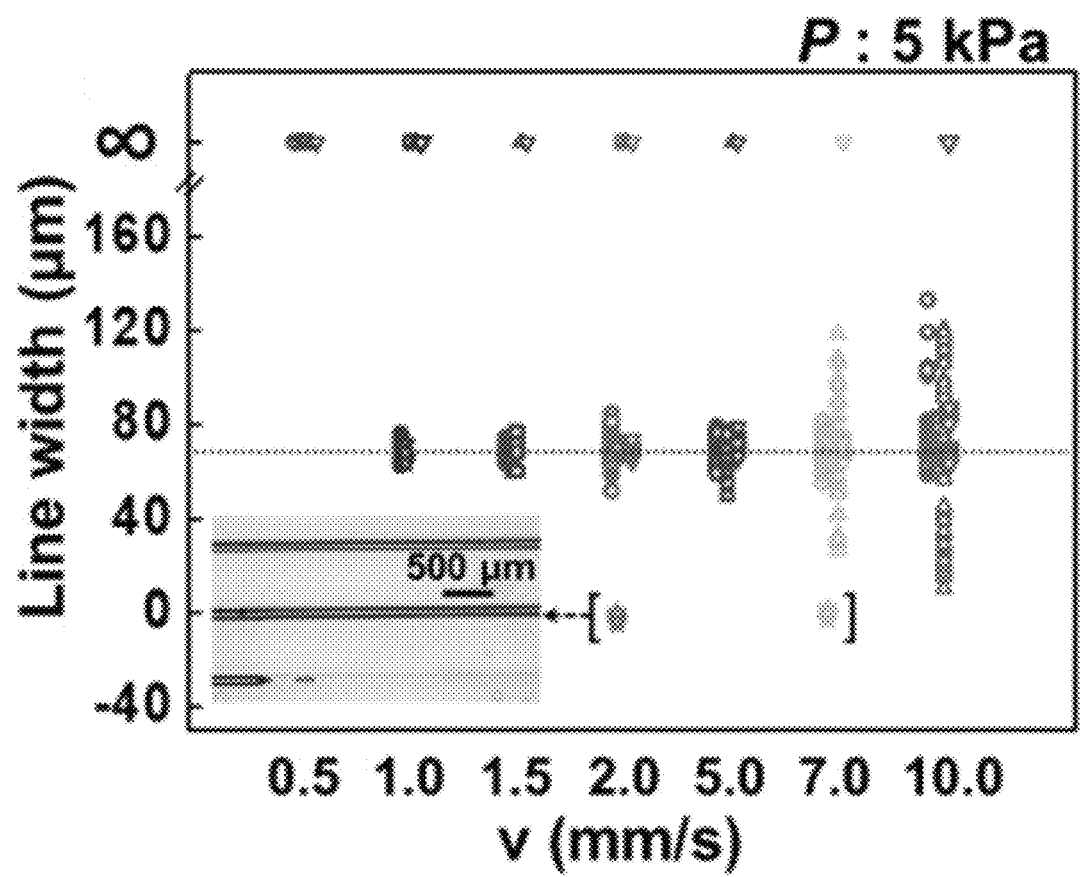

[Fig. 2d]
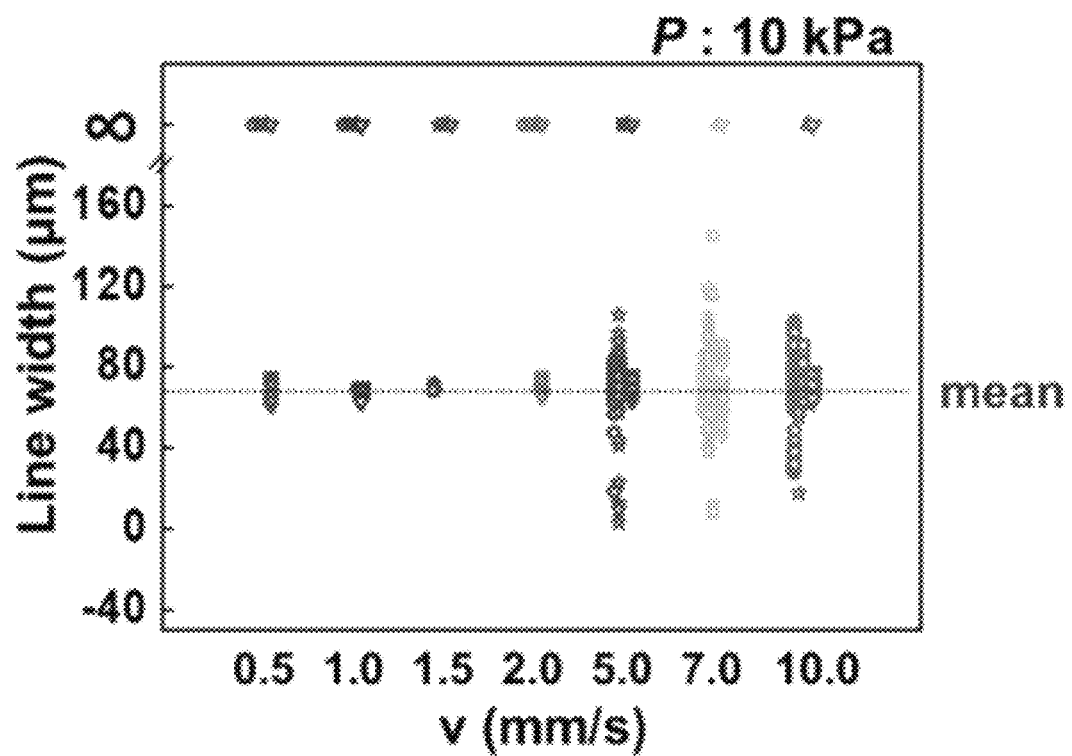

[Fig. 2e]
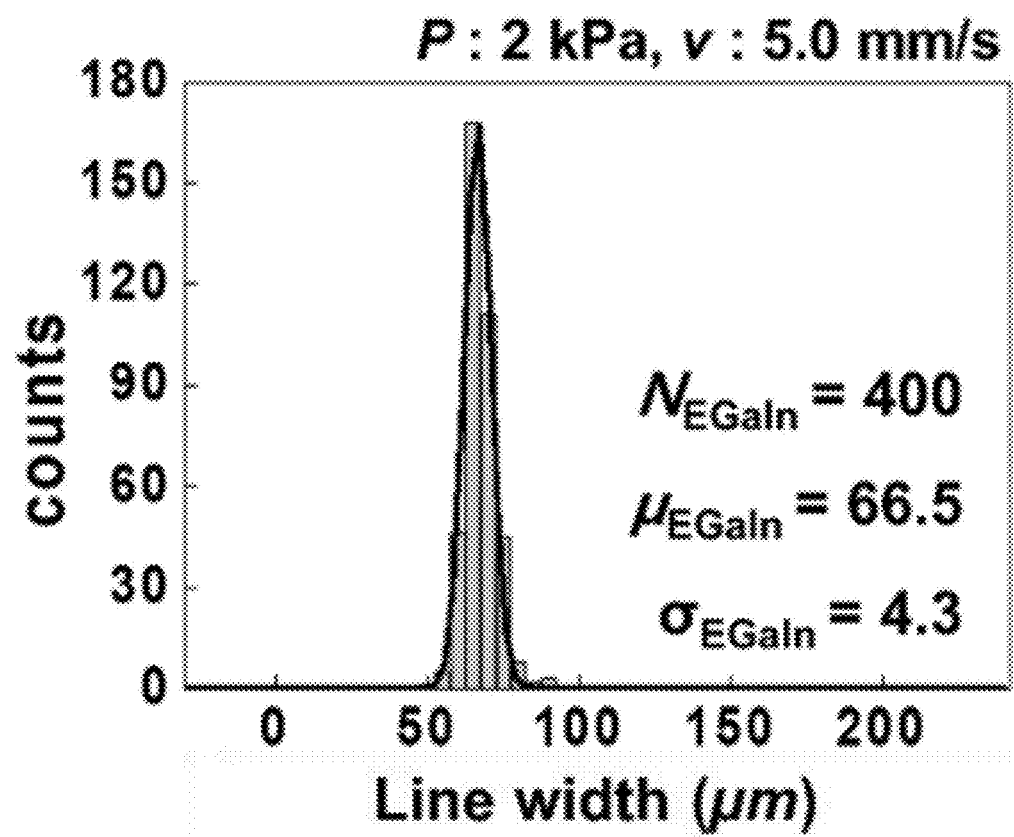

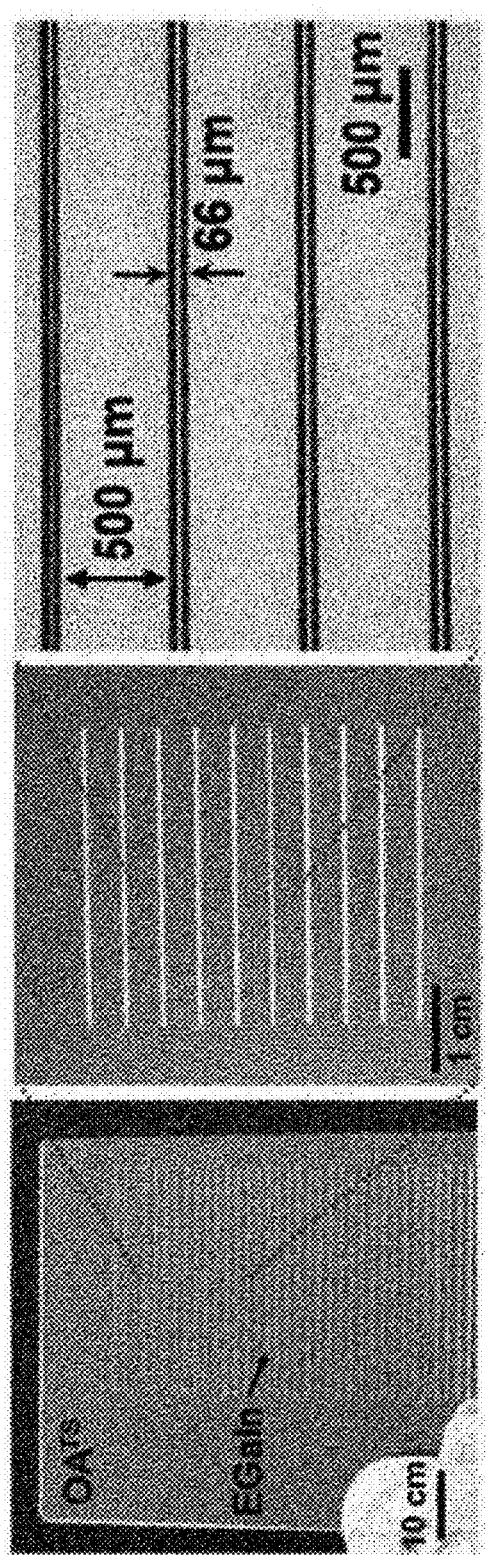
[Fig. 2f]

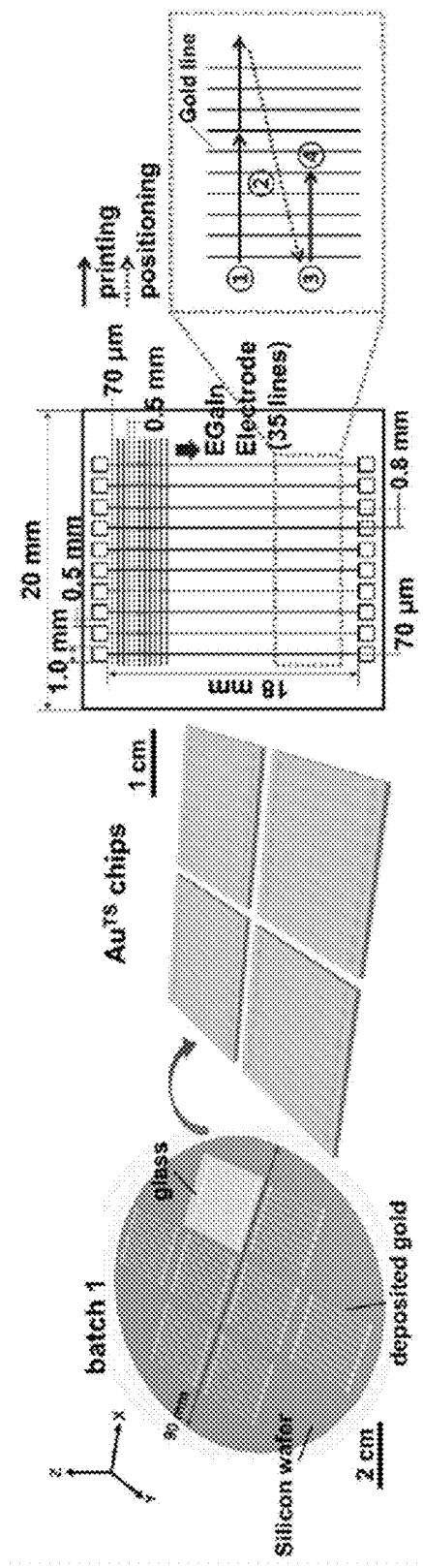
[Fig. 3a]

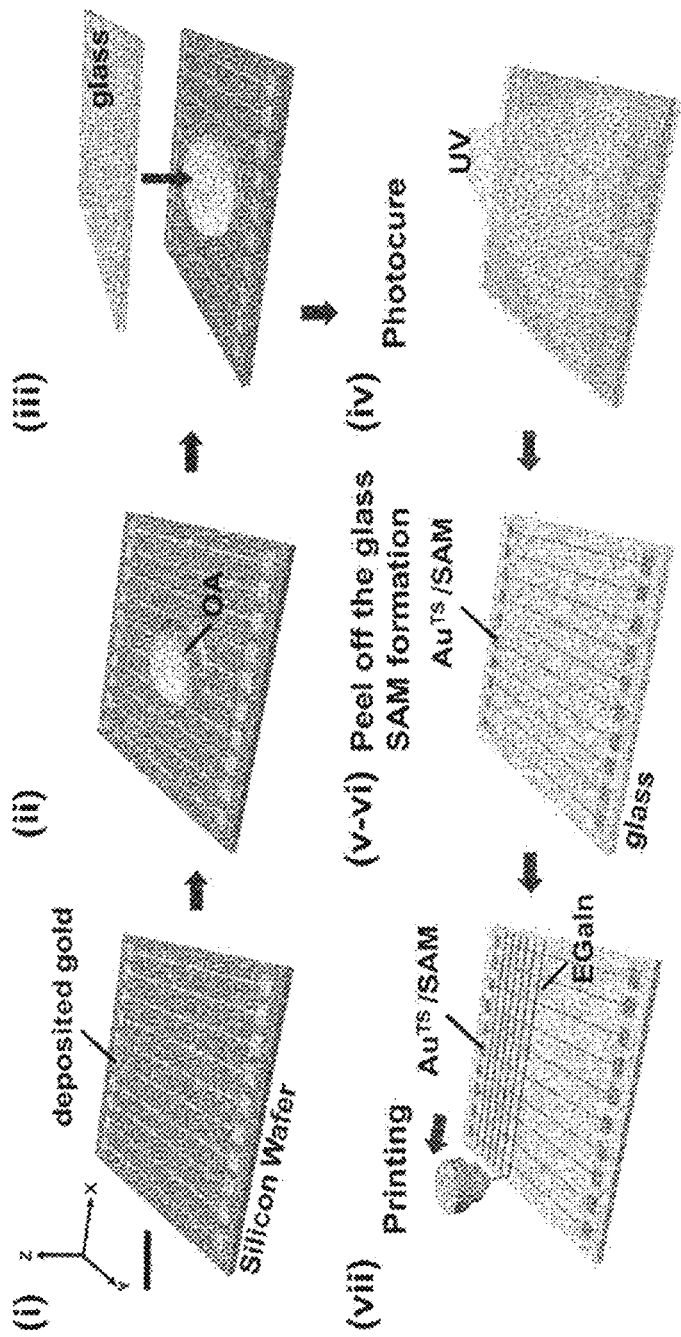
[Fig. 3b]

[Fig. 3c]
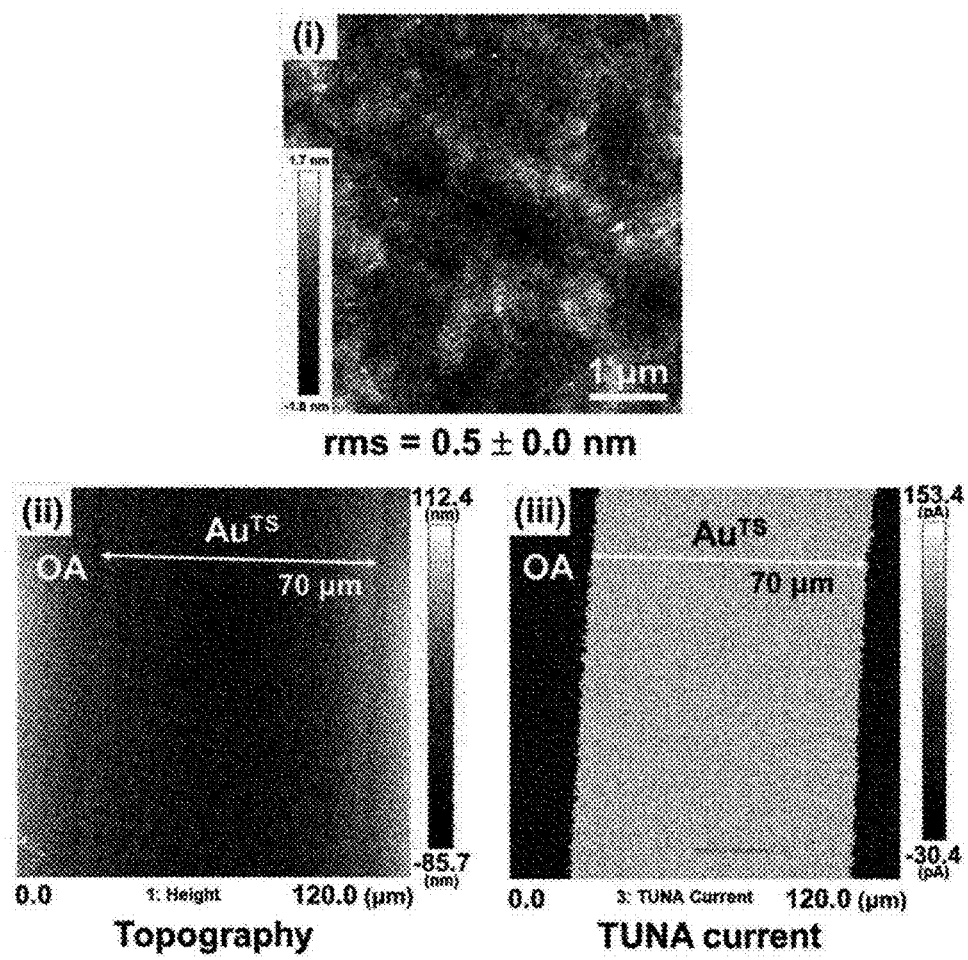

[Fig. 4a]
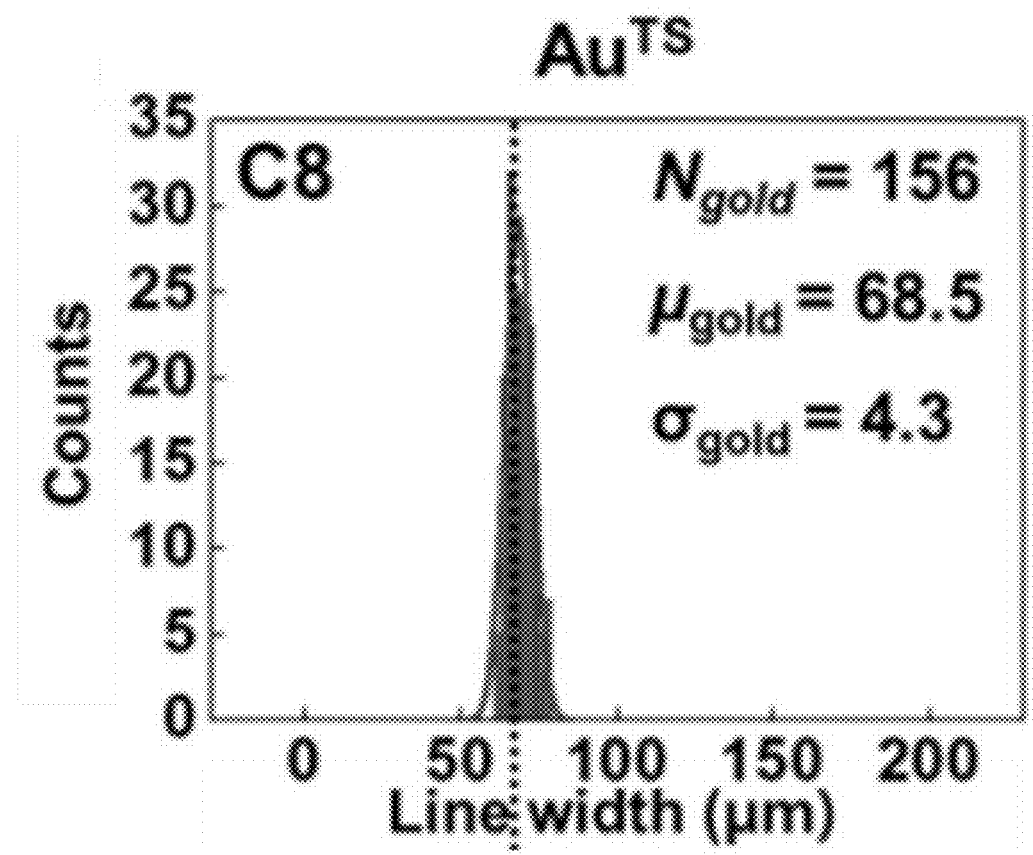

[Fig. 4b]
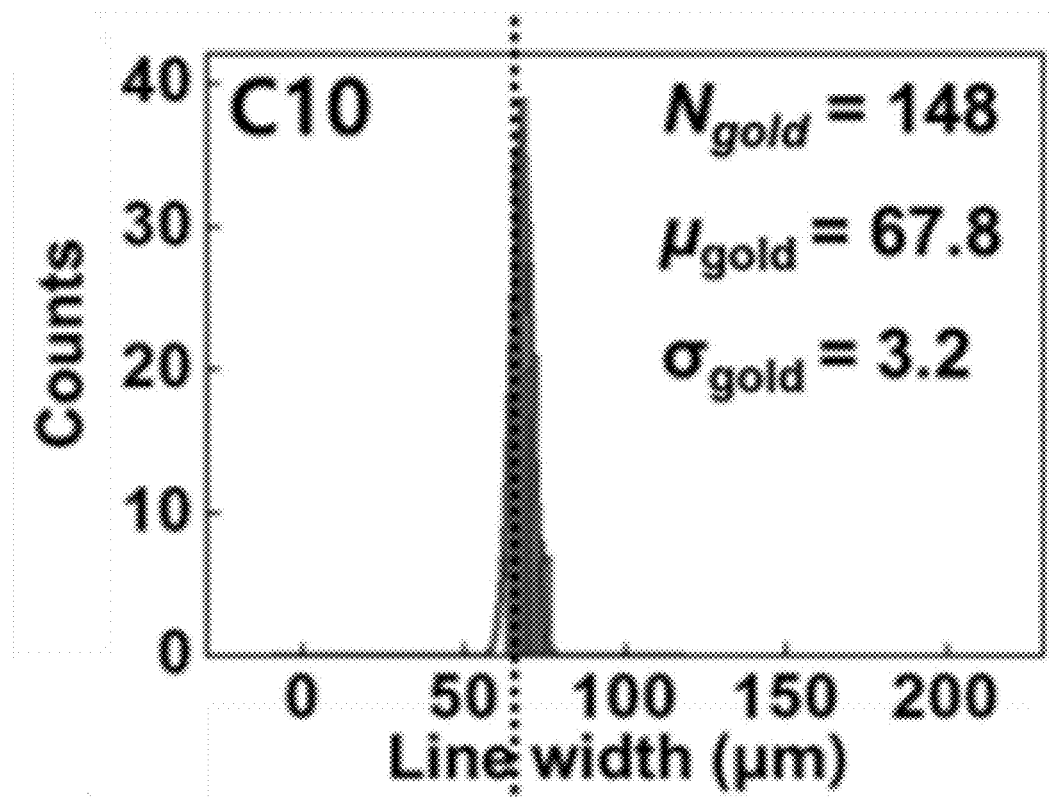

[Fig. 4c]
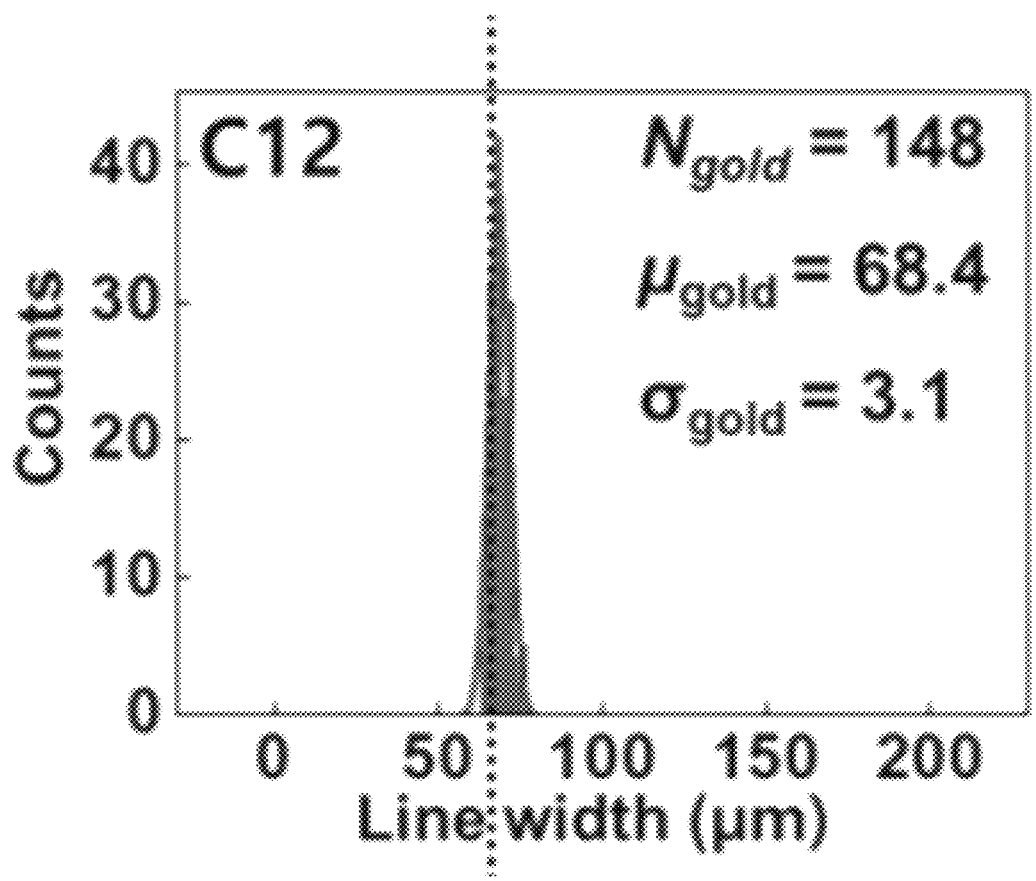

[Fig. 4d]
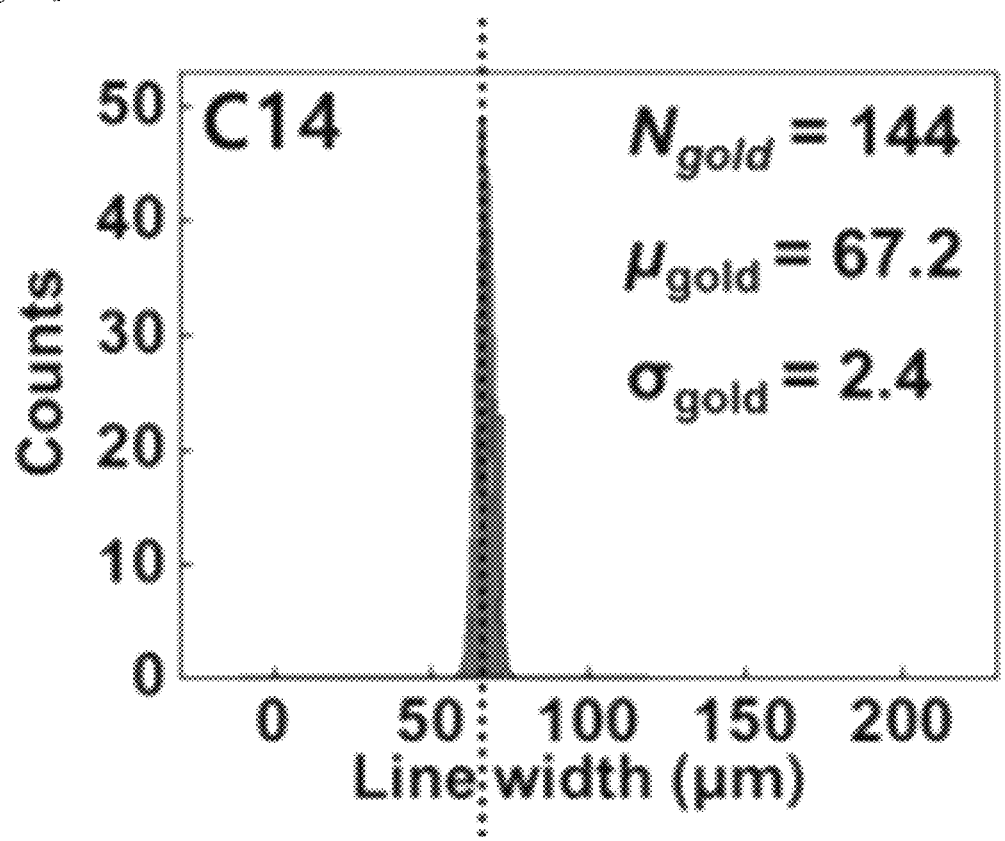

[Fig. 4e]
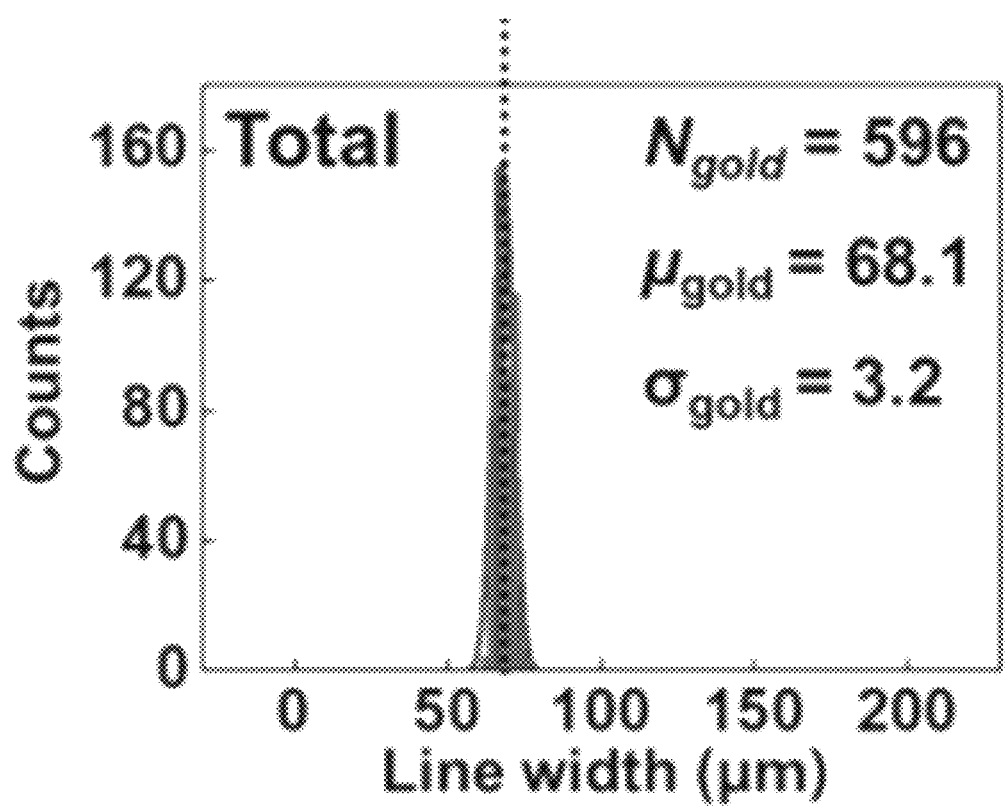

[Fig. 4f]
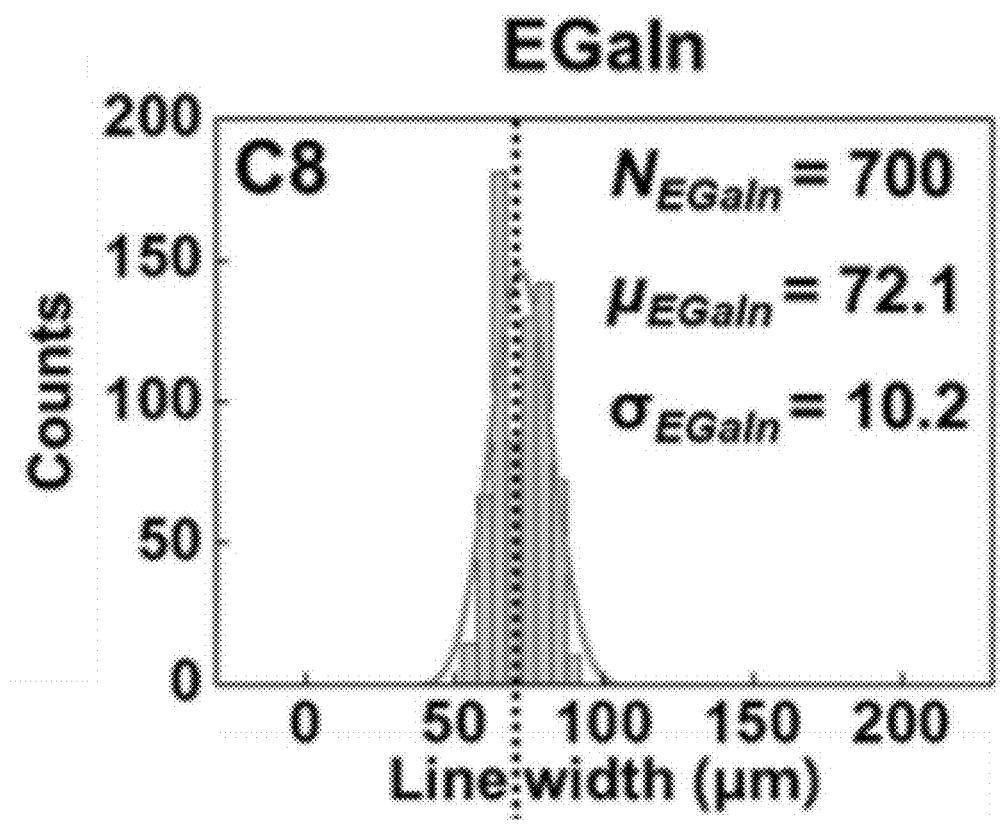

[Fig. 4g]
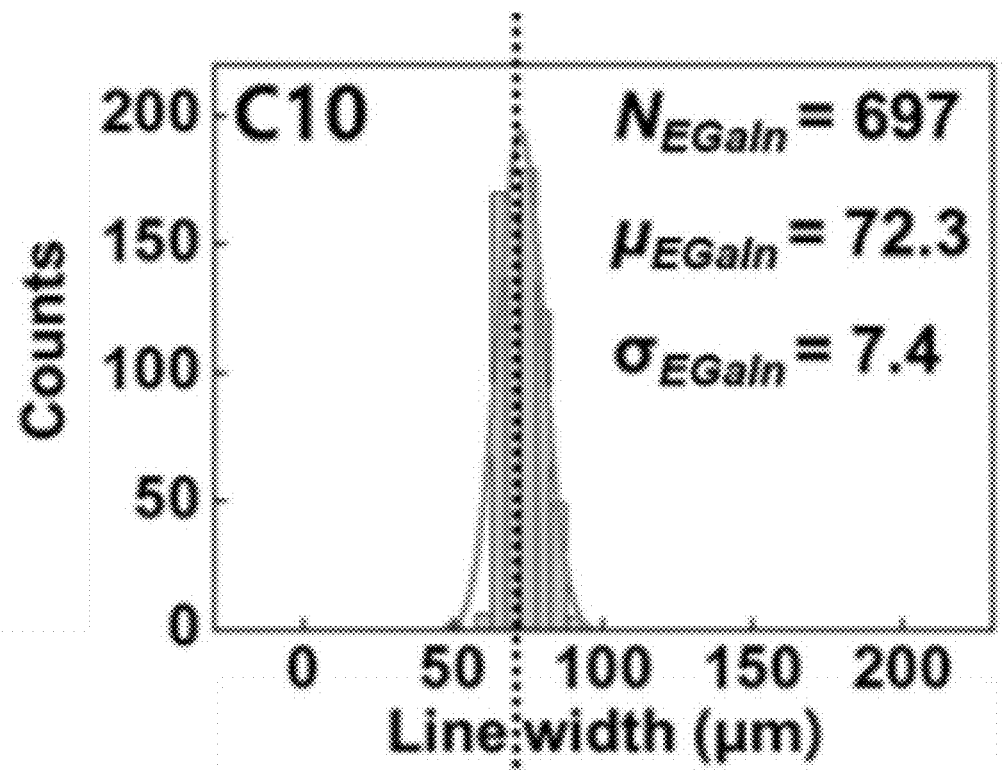

[Fig. 4h]
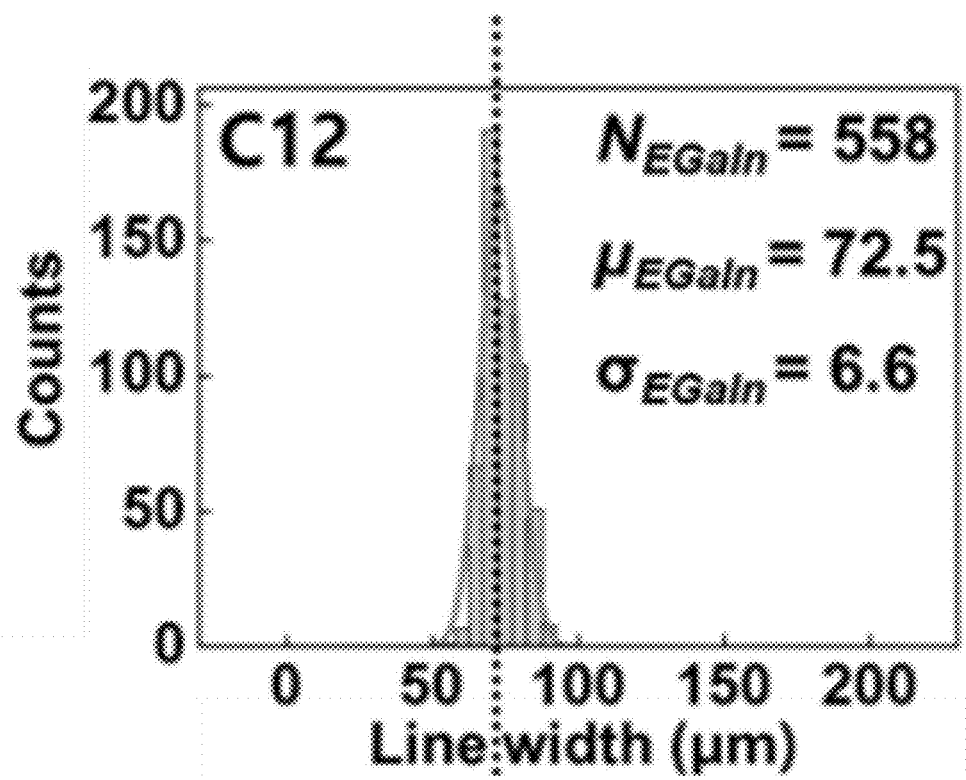

[Fig. 4i]
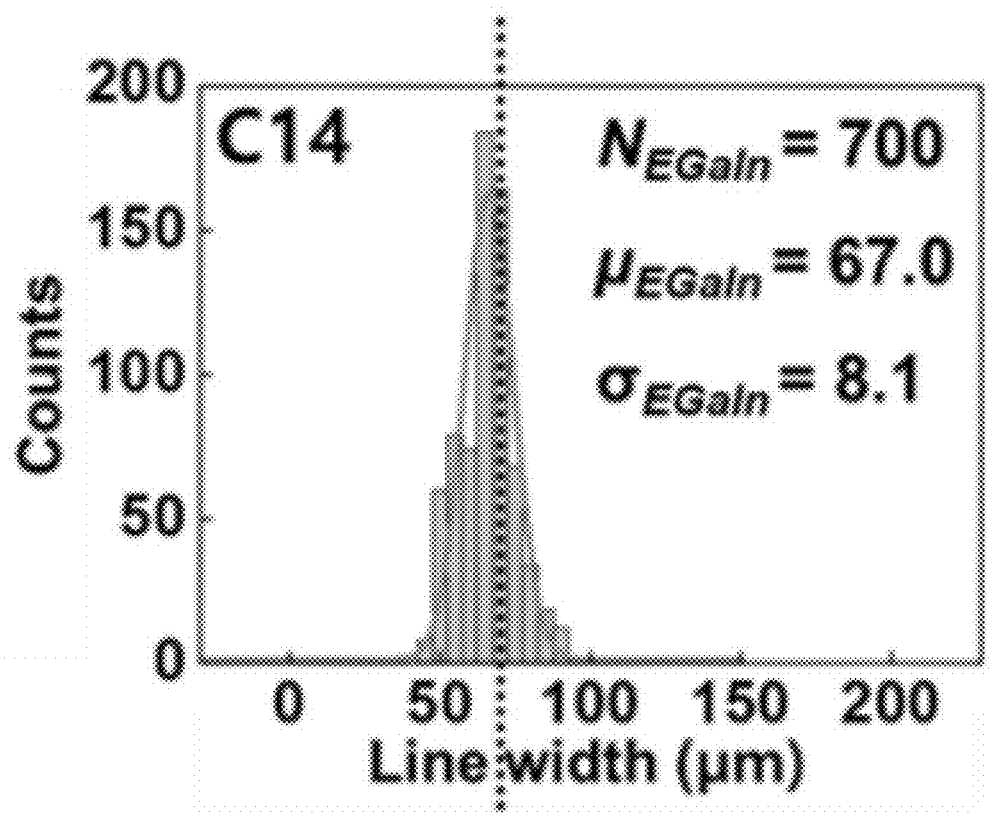

[Fig. 4j]
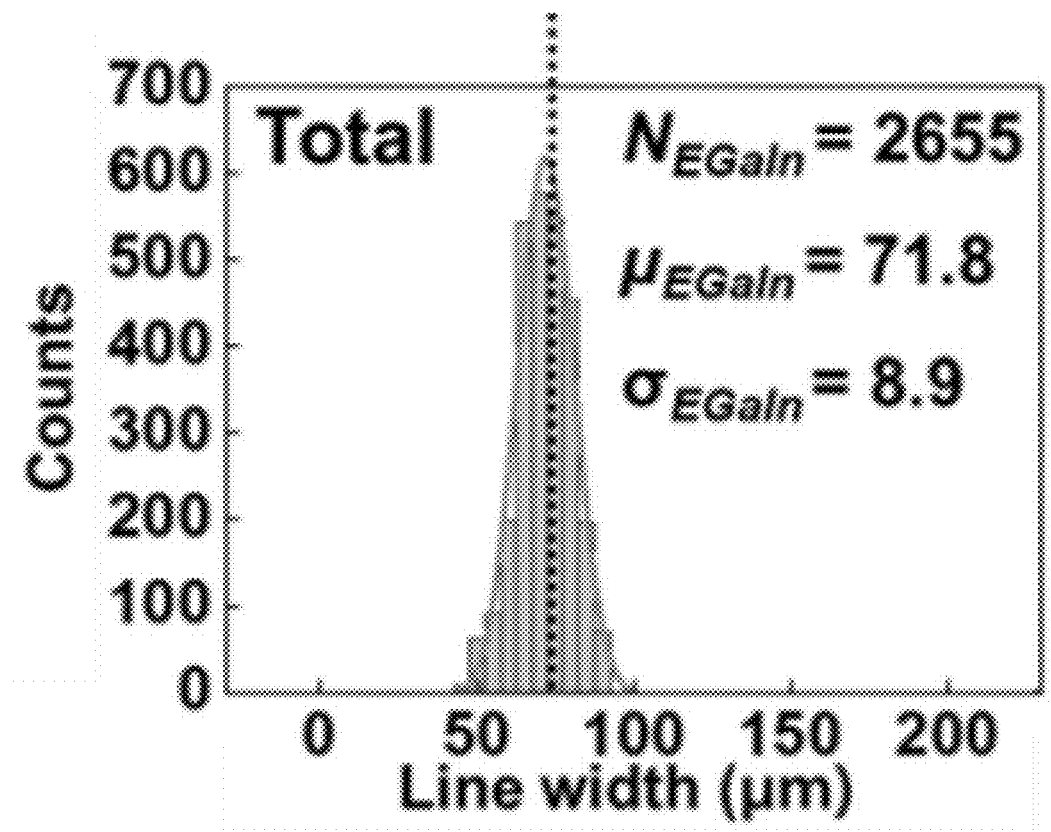

[Fig. 4k]
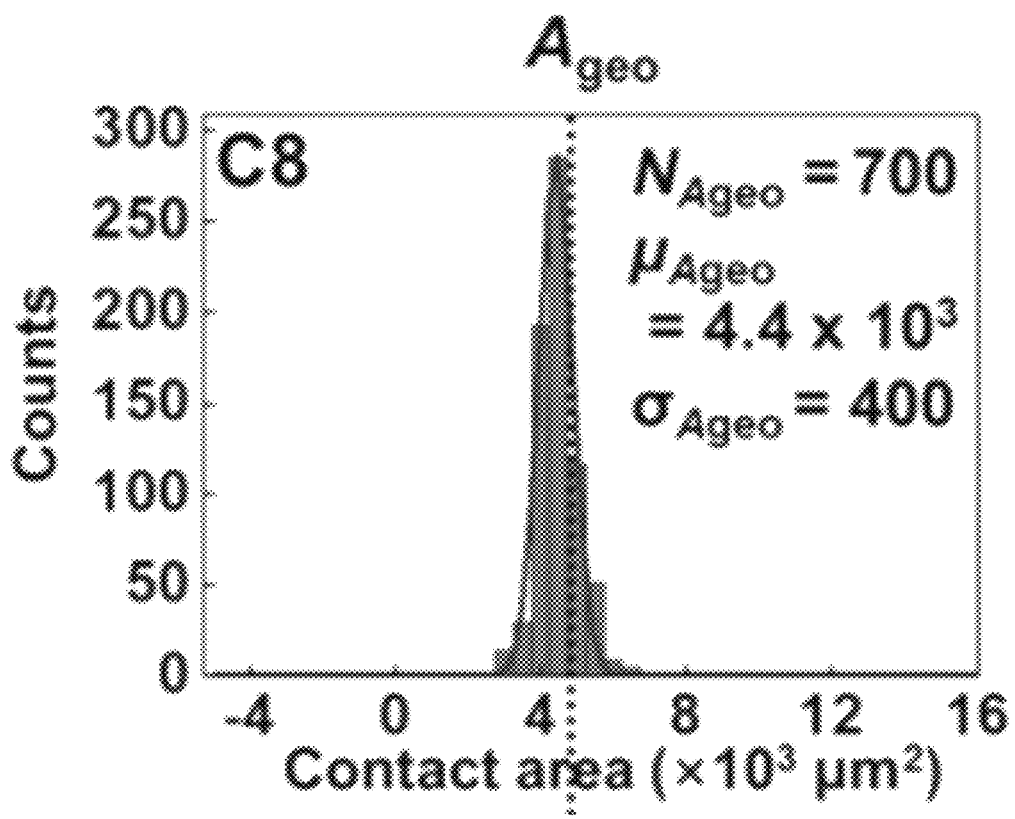

[Fig. 41]
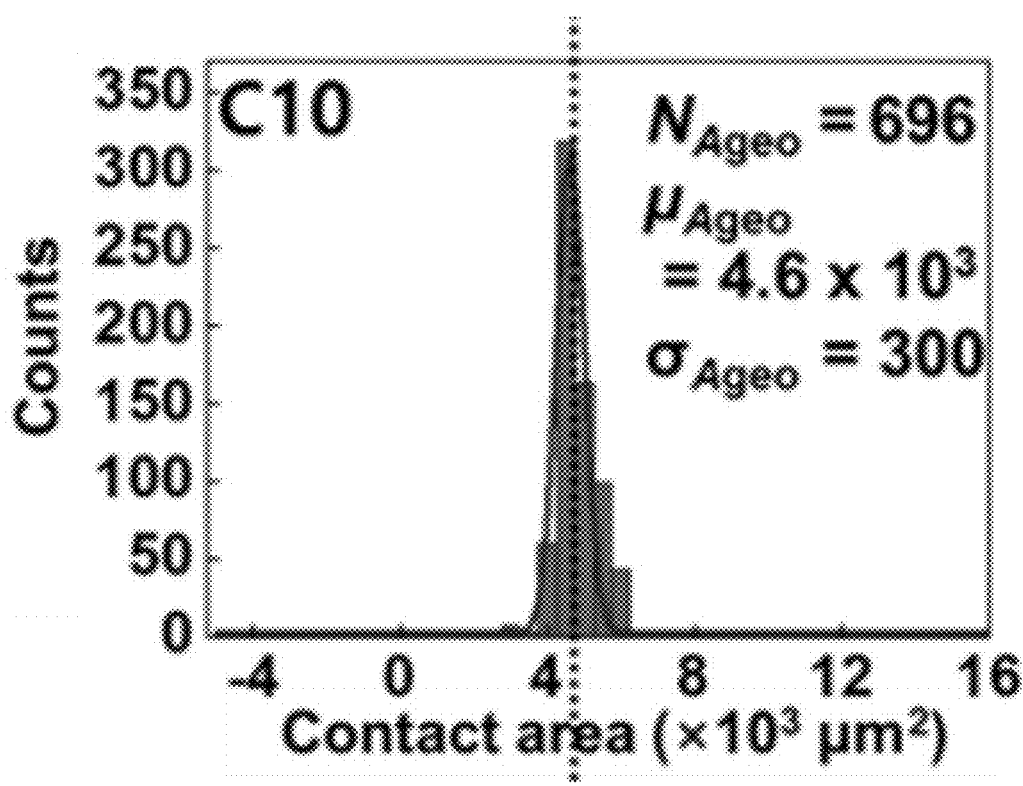

[Fig. 4m]
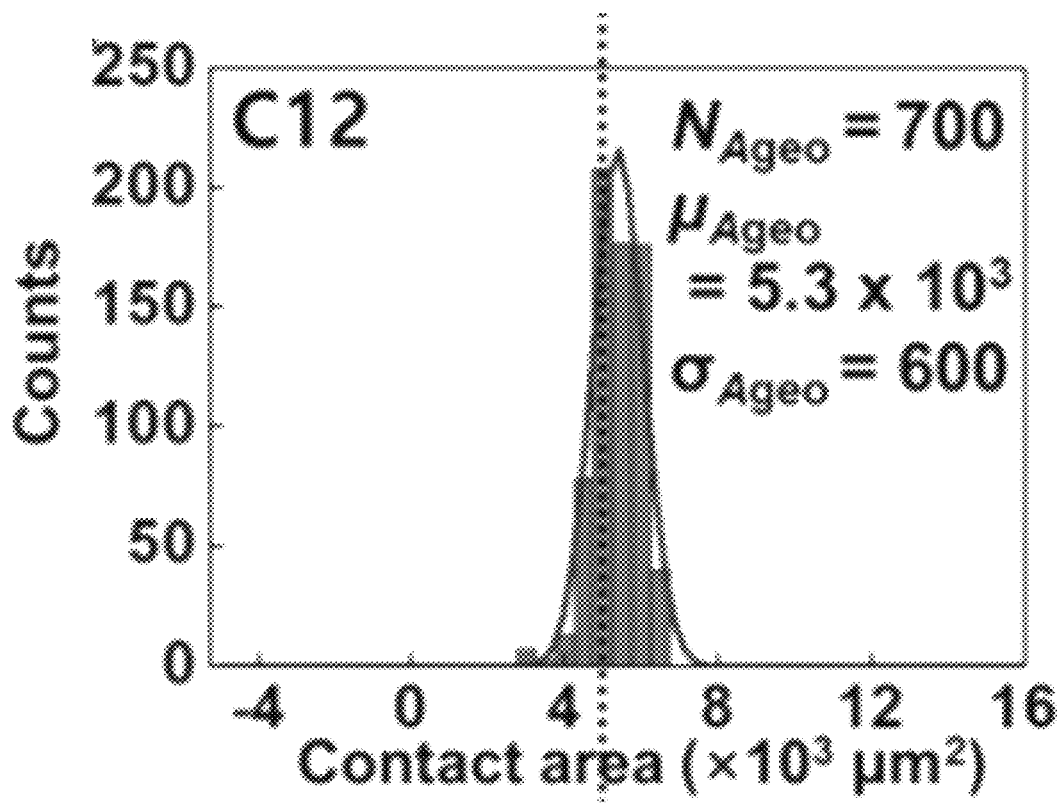

[Fig. 4n]
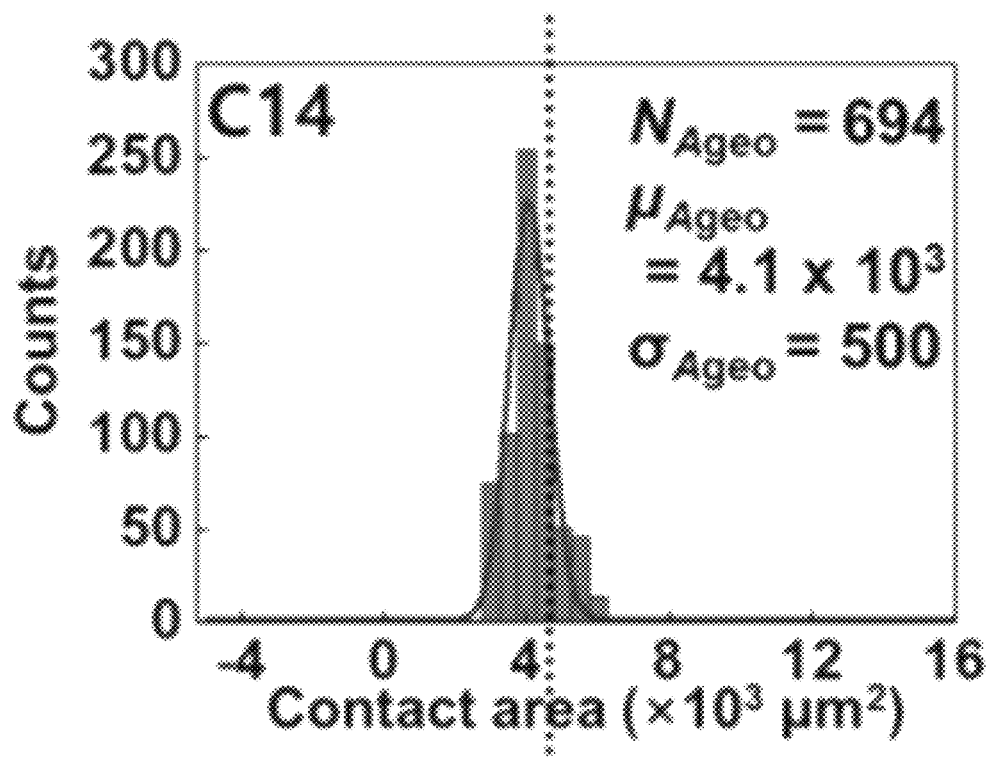

[Fig. 4o]
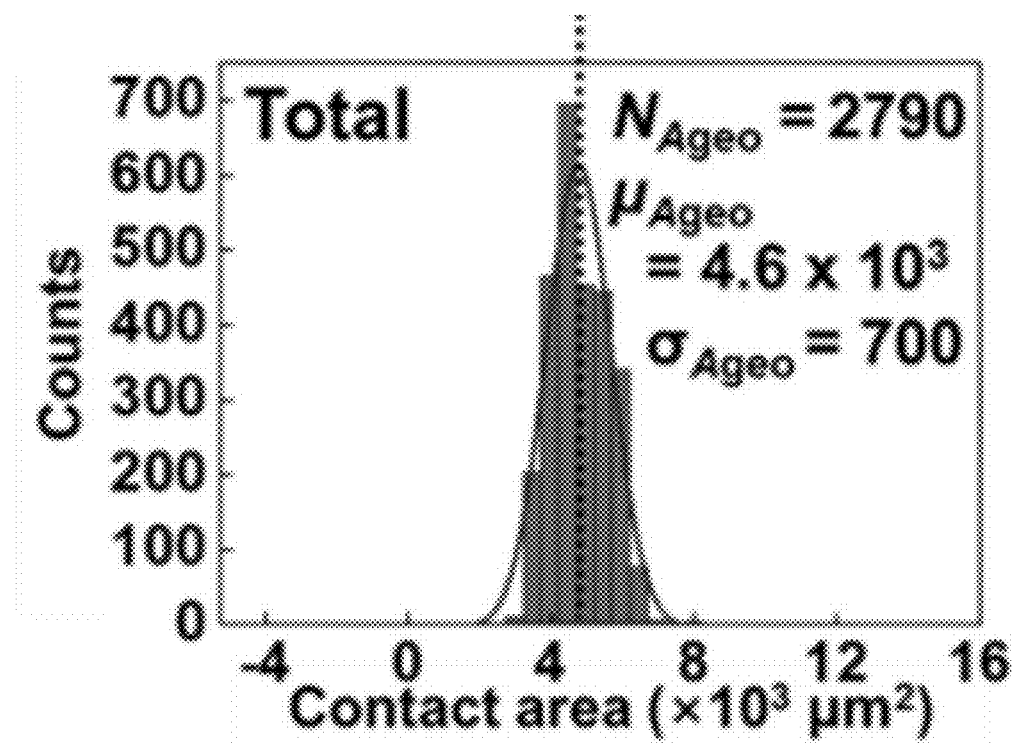

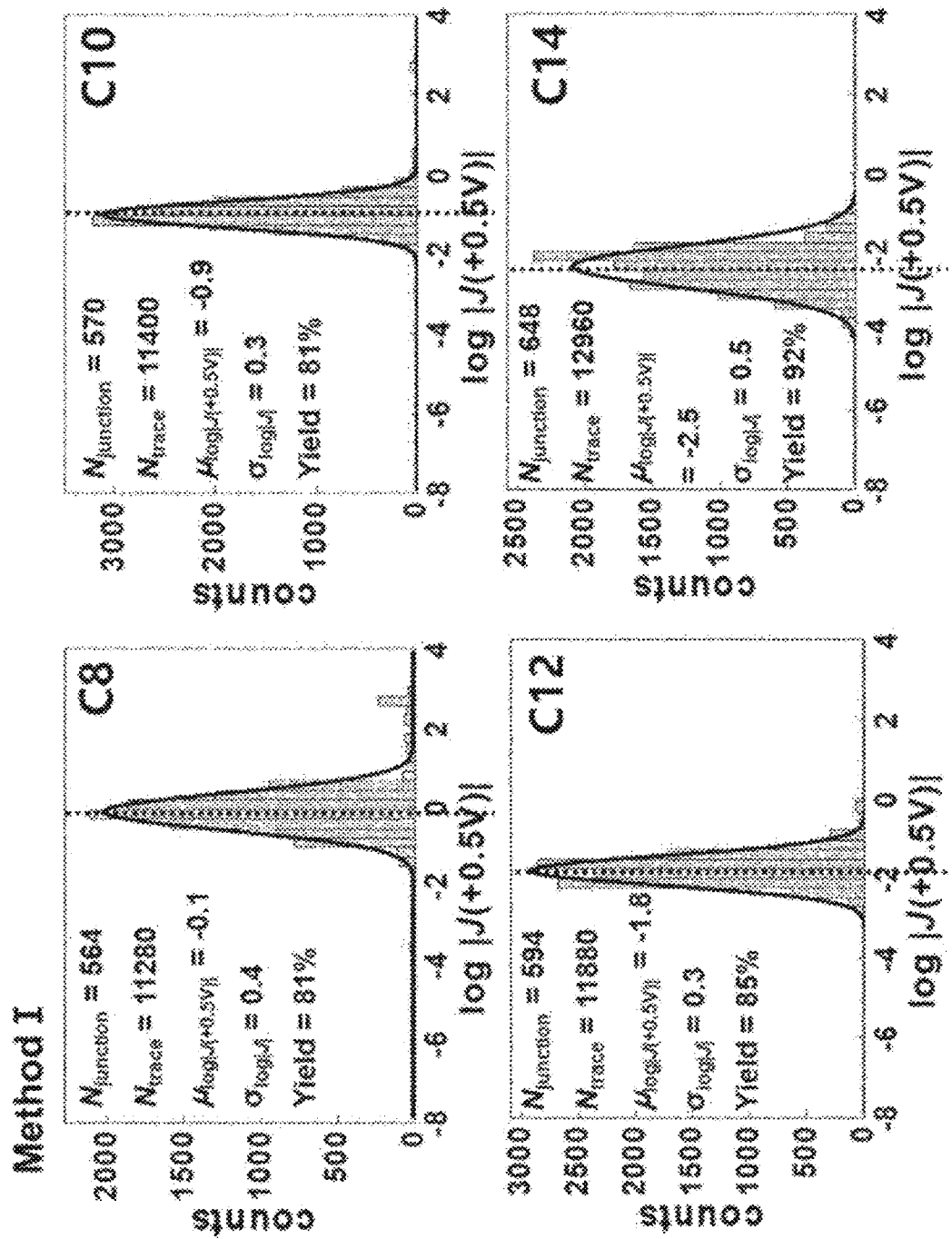
[Fig. 5a]

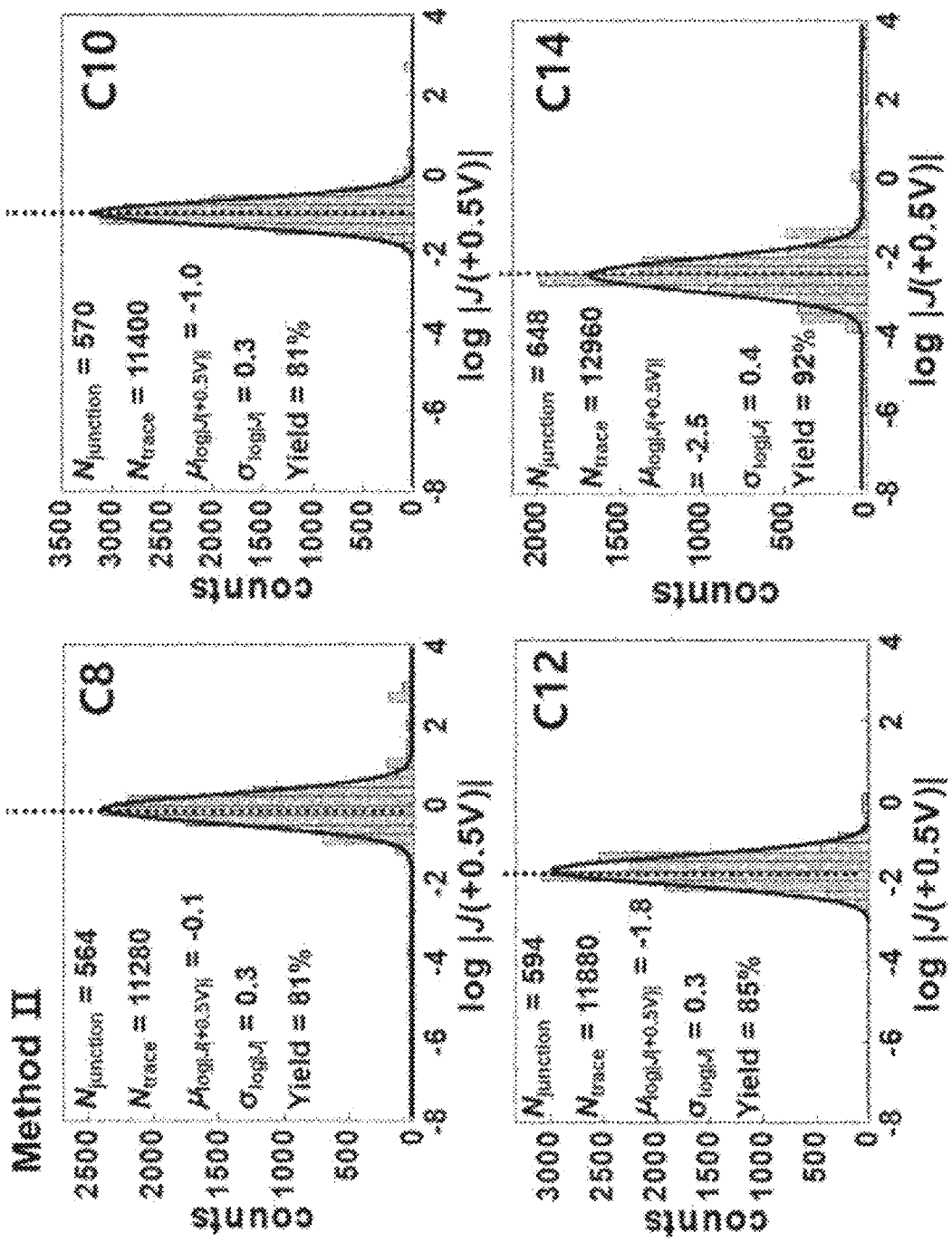
[Fig. 5b]

[Fig. 6a]
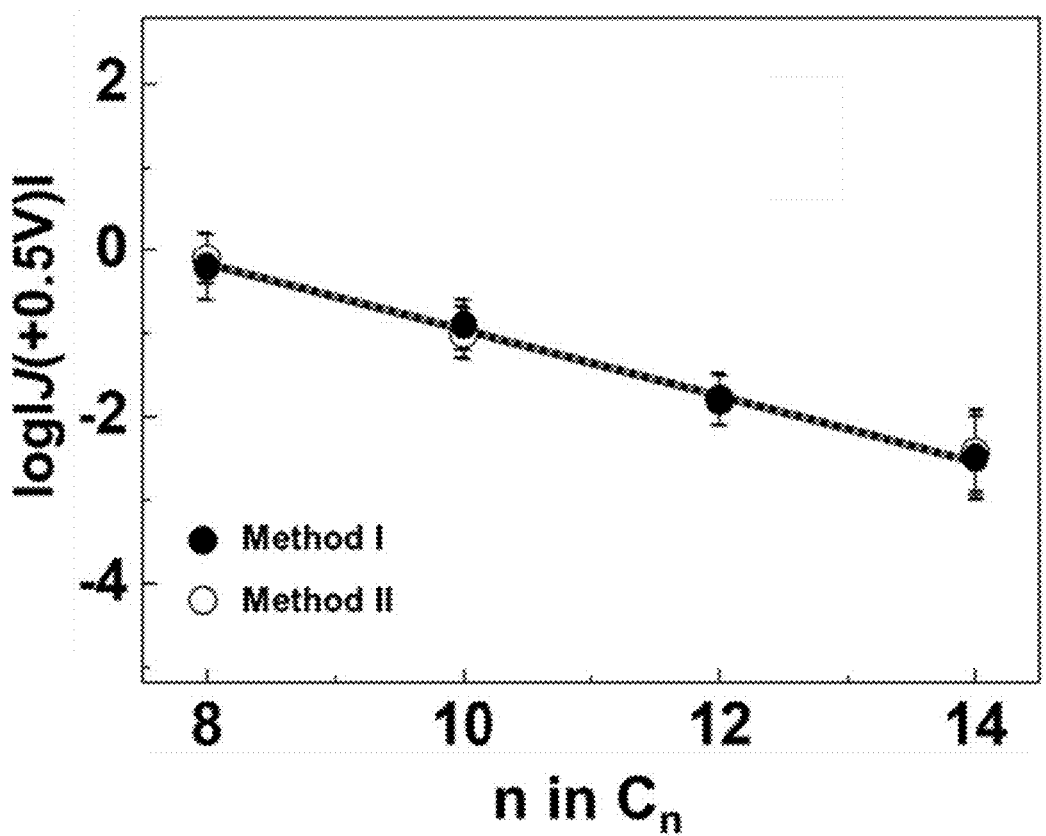

[Fig. 6b]
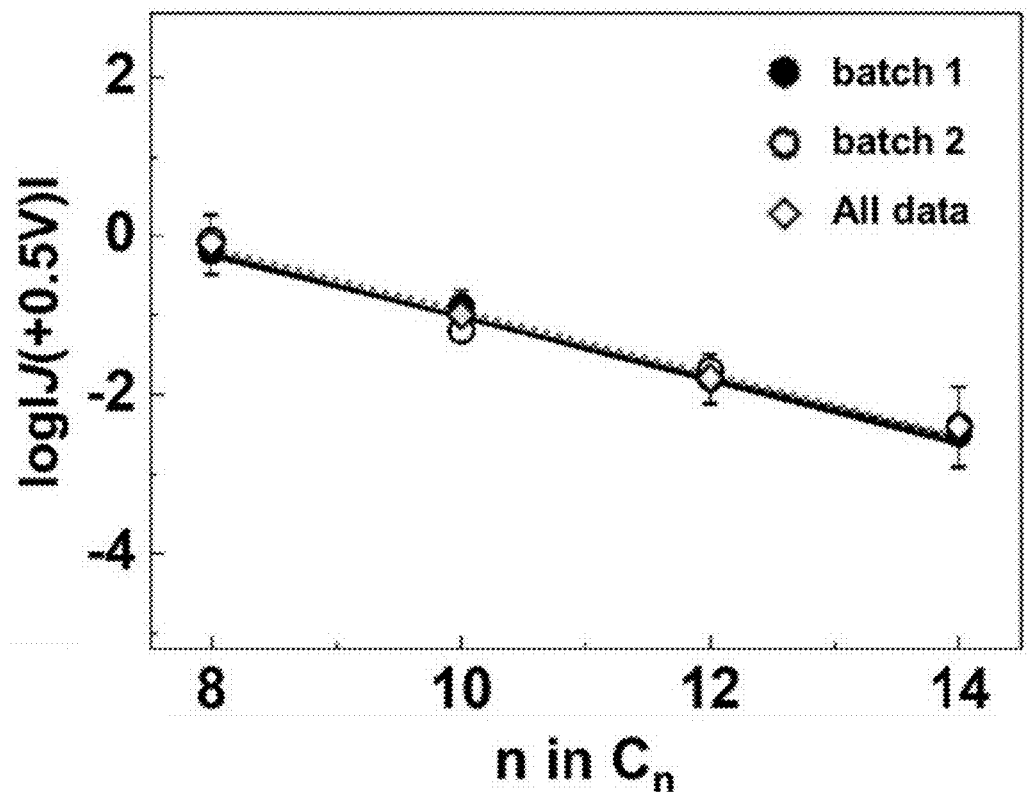

[Fig. 6c]
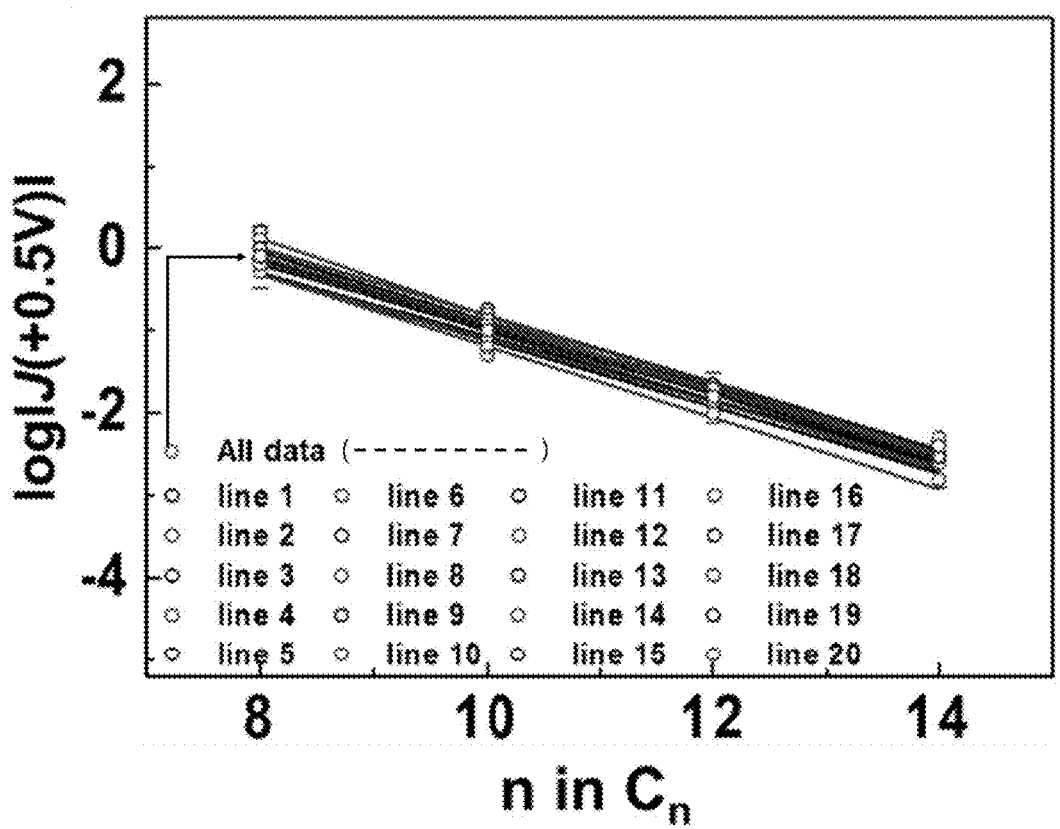

[Fig. 6d]
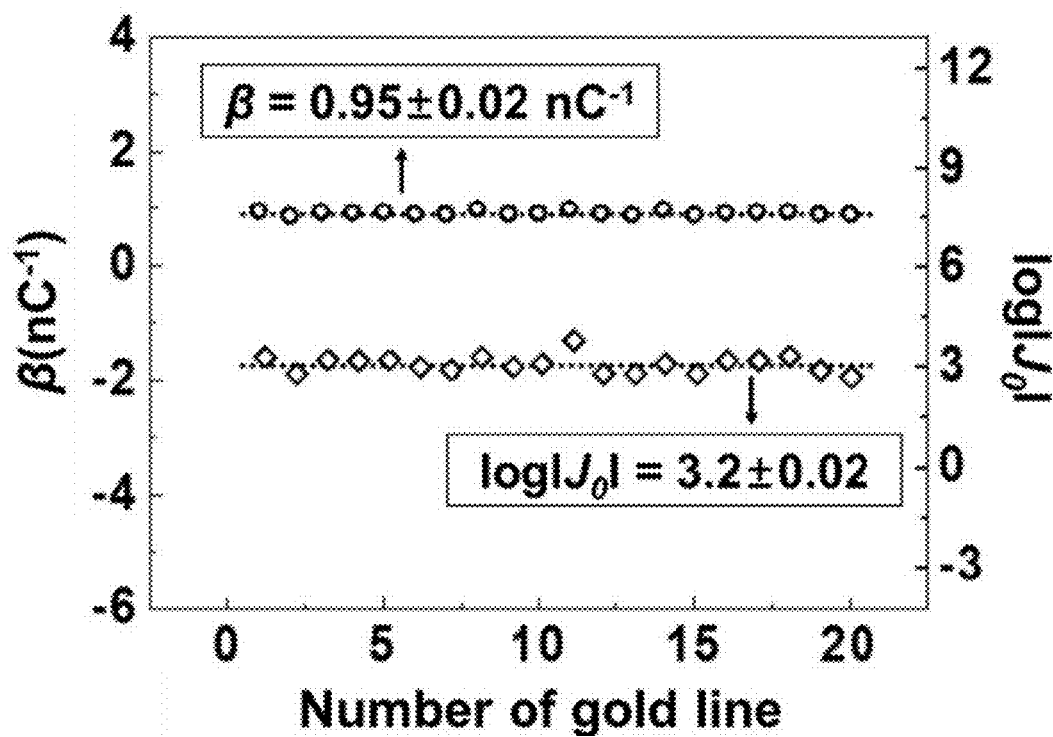

[Fig. 7a]
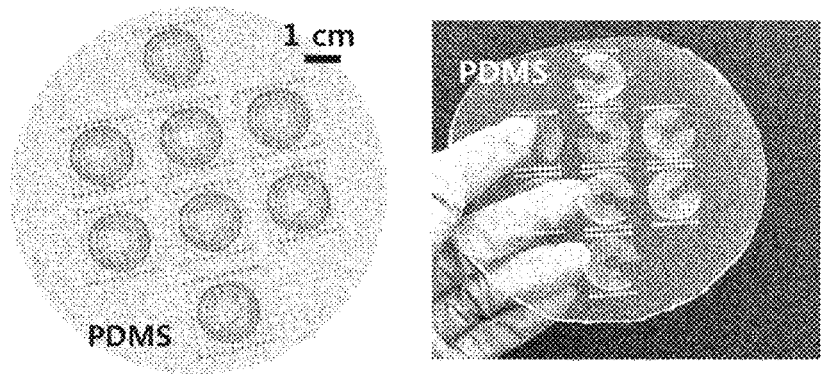
[Fig. 7b]
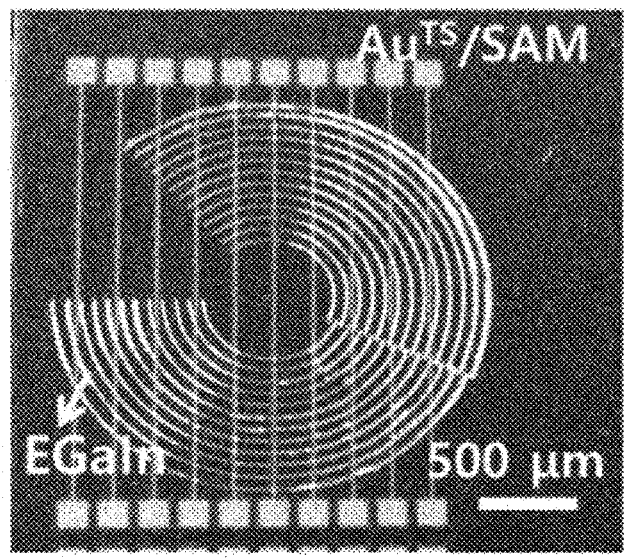
[Fig. 7c]
(i)        (ii)
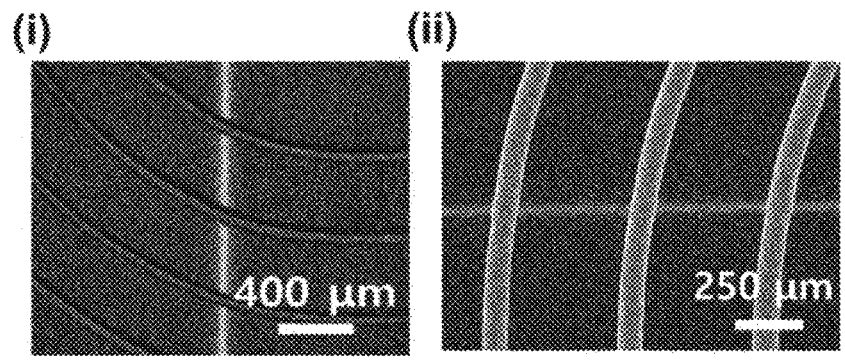

[Fig. 7d]
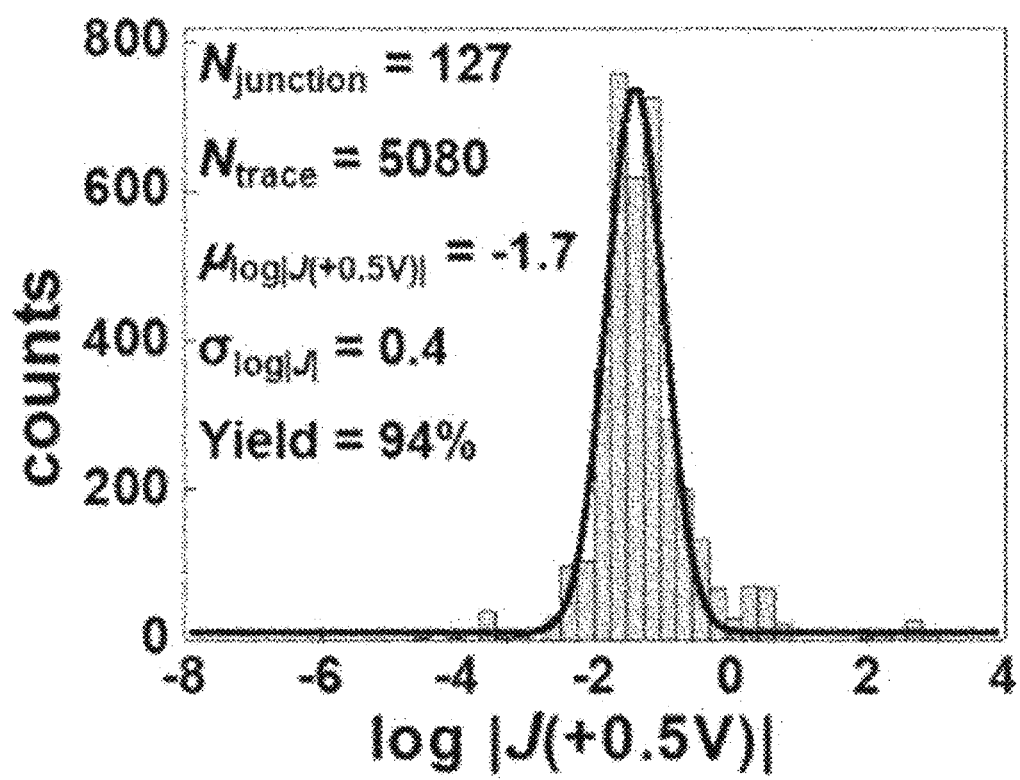

[Fig. 7e]
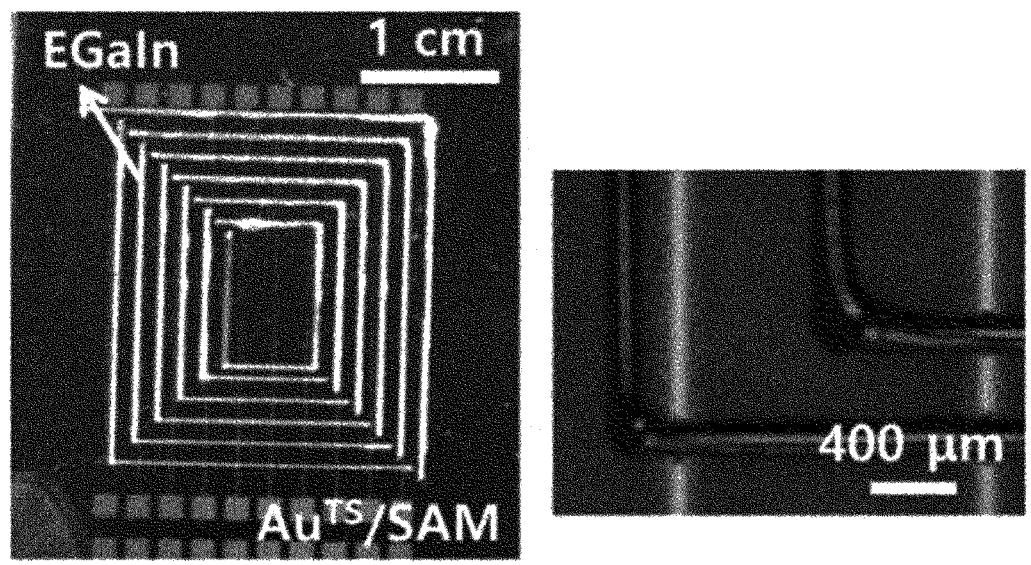
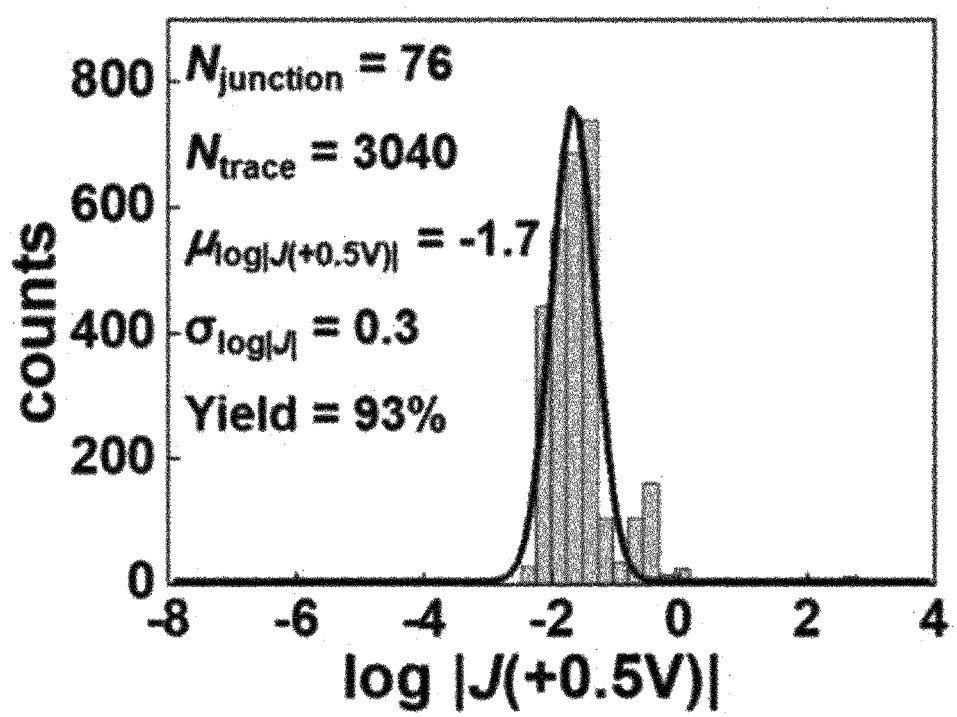

[Fig. 7f]
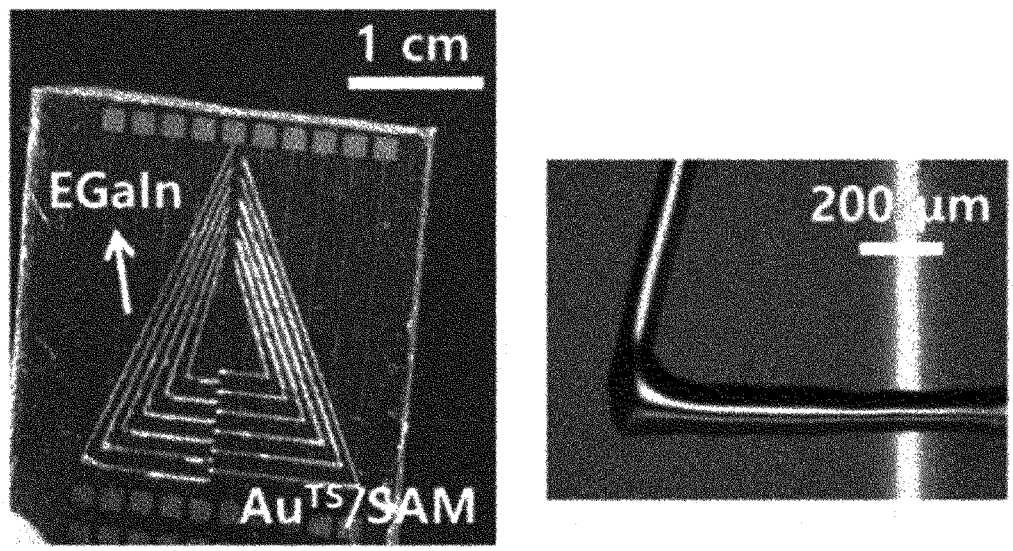
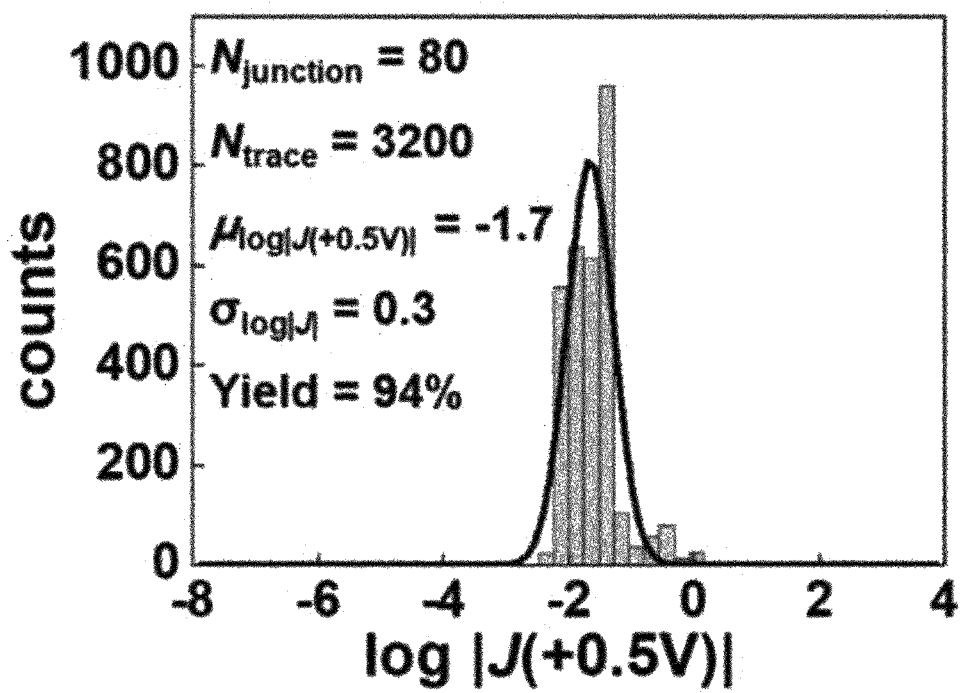

METHOD FOR FABRICATING ELECTRODE BASED ON LIQUID METAL

CROSS REFERENCE TO RELATED APPLICATIONS

This application is a U.S. National Stage Application of International Application No. PCT/KR2021/009737, filed on Jul. 27, 2021, which claims the benefit under 35 USC 119(a) and 365(b) of Korean Patent Application No. 10-2020-0093806, filed on Jul. 28, 2020 and Korean Patent Application No. 10-2021-0094258, filed on Jul. 19, 2021, in the Korean Intellectual Property Office, the entire disclosures of which are incorporated herein by reference for all purposes.

TECHNICAL FIELD

The present invention relates to a method for fabricating a liquid metal-based electrode, and more specifically to a technology for introducing an electrode into a self-assembled monolayer (SAM) by liquid metal printing.

BACKGROUND ART

Monolayer films are very thin films consisting of a single layer of molecules. Monolayer films are susceptible to damage by external stimuli when used in organic electronic devices. For this reason, it is very difficult to introduce metal electrodes onto the surface of monolayer films. A conventional approach for electrode introduction usually relies on how a metal is deposited on an electrically active surface under high-temperature energy conditions. According to this approach, the high-temperature energy tends to damage an organic thin film, failing to achieve the desired performance.

Printability will significantly expand the application scope of electronics, particularly for large-area electronic displays, sensors, solar cells, antennas, and transistors. Unlike for conventional electronic devices, printed electronics can be applied to arbitrary surfaces in a cost-effective and high-throughput manner. Large-area electronic devices incorporating ultrathin single-molecule layers such as self-assembled monolayers (SAMs) promise extremely tiny electrical circuits that access fine-tuning of electronic functions via wave function engineering at the atomic level. However, SAM-based tunneling junctions have never been combined with a direct printing technology, primarily owing to difficulty to satisfy the following needs: avoidance of damage of surface of monolayers during printing, maintenance of accuracy and precision of tunneling performance, high yield, and high reproducibility. If one can develop a combined molecular and printed electronics and satisfy such needs, one would unleash the opportunity to manufacture large quantities of standardized molecular-scale electronic devices through automation technology.

DETAILED DESCRIPTION OF THE INVENTION

Problems to be Solved by the Invention

The present invention has been made in an effort to solve the problems of the prior art, and one aspect of the present invention is to provide a method for fabricating a liquid metal-based electrode by printing of a liquid metal, enabling the manufacture of a molecular electronic device without damage to a monolayer film.

Means for Solving the Problems

A method for fabricating a liquid metal-based electrode according to an embodiment of the present invention includes (a) preparing a first substrate having a self-assembled monolayer (SAM) arranged on one surface thereof and (b) printing a liquid metal in a predetermined pattern in contact with the surface of the self-assembled monolayer by using a printing device to form a liquid metal electrode, the printing device including a needle through which the liquid metal is ejected and a controller controlling the movement of the needle.

According to the method of the present invention, step (a) may include: depositing a metal in a predetermined pattern on one surface of a second substrate to form a thin metal electrode; forming an adhesive layer between the one surface of the second substrate and one surface of a first substrate; separating the first substrate from the second substrate to transfer the metal electrode to the one surface of the first substrate; and forming a self-assembled monolayer (SAM) on the surface of the transferred metal electrode.

According to the method of the present invention, the adhesive layer may have an intaglio pattern corresponding to the pattern of the transferred metal electrode and the intaglio pattern may be transferred to the one surface of the first substrate.

According to the method of the present invention, the printing device may further include a syringe accommodating the liquid metal and connected to the needle and a syringe pump pressurizing the syringe to eject the liquid metal.

According to the method of the present invention, in step (b), the syringe pump may operate at a pressure of 8.5 to 9.5 kPa and the needle may move at a velocity of 4 to 6 mm/s to print the liquid metal.

According to the method of the present invention, the liquid metal may be eutectic gallium-indium (EGaIn).

According to the method of the present invention, the self-assembled monolayer may be formed of an alkanethiolate.

The features and advantages of the present invention will become apparent from the following description with reference to the accompanying drawings.

Prior to the detailed description of the invention, it should be understood that the terms and words used in the specification and the claims are not to be construed as having common and dictionary meanings but are construed as having meanings and concepts corresponding to the technical spirit of the present invention in view of the principle that the inventor can define properly the concept of the terms and words in order to describe his/her invention with the best method.

Effects of the Invention

The method of the present invention is based on a combination of printed electronics and molecular electronics and enables the manufacture of large quantities of molecular electronic devices with high reproducibility and reliability in a short time through liquid metal dispenser automation technology.

In addition, the method of the present invention can be applied to geometric monolayer films, avoiding the need for surface lithography, and is not limited by material properties.

Furthermore, according to the method of the present invention, a liquid metal can be printed in various patterns on a monolayer film. Therefore, the method of the present invention is expected to greatly contribute to the manufacture of molecular electronic devices based on single molecules.

BRIEF DESCRIPTION OF THE DRAWINGS

FIG. 1a schematically shows direct printing of an EGaIn microelectrode on SAM-bound $Au^{TS}$, FIG. 1b is a photograph of 350 printed molecular junctions corresponding to one $Au^{TS}$ chip, FIG. 1c shows optical microscopy images of the printed molecular junctions of FIG. 1b at different magnification (geometrical contact area ($A_{geo}$) is defined as the area of cross-section between $Au^{TS}$ and EGaIn lines), and FIG. 1d shows scanning electron microscopy (SEM) images of the printed molecular junctions from angles of 90° and 45°.

FIG. 2a shows procedures to fabricate template-stripped optical adhesive ($OA^{TS}$) and four parameters (P, ID, h, v) that determine the quality of printing, FIGS. 2b to 2d shows distributions of line width of printed EGaIn microelectrode at various printing conditions (P=2, 5, 10 kPa; v=0.5, 1.0, 2.0, 5.0, 7.0, 10.0 mm/s), FIG. 2e is a histogram of line width of printed EGaIn microelectrode obtained at the optimal printing condition, and FIG. 2f shows photo and optical microscopy images of a pattern of printed EGaIn microelectrode obtained at the optimized printing condition.

FIG. 3a is a diagram showing an array of printed molecular junctions on $Au^{TS}$ chip, FIG. 3b shows a step-by-step description of making printed large-area tunnel junctions, and FIG. 3c shows the characteristics of $Au^{TS}$ electrodes ((i) and (ii) surface topography (iii) electrical property were analyzed using AFM and tunneling AFM (TUNA) techniques, respectively).

FIGS. 4a to 4d are histograms showing distribution of line width (μm) for $Au^{TS}$ on individual alkanethiolates (Cn, n=8, 10, 12, 14), FIG. 4e is a histogram showing combined distribution of line width for $Au^{TS}$, FIGS. 4f to 4i are histograms showing distribution of line width (μm) for EGaIn electrodes formed on individual alkanethiolates (Cn, n=8, 10, 12, 14), FIG. 4j is a histogram showing combined distribution of line width for each EGaIn, FIGS. 4k to 4n are histograms showing geometrical contact area ($A_{geo}$) of junctions on individual alkanethiolates (Cn, n=8, 10, 12, 14), and FIG. 4o is a histogram showing combined geometrical contact area.

FIGS. 5a and 5b are histograms showing current densities (log |J|, +0.5 V) for alkanethiolate SAMs (Cn where n=8, 10, 12, 14) measured via different methods (Method I and Method II).

FIG. 6a shows current densities (log |J|) against the number of carbon (n in Cn) between the Methods I and II, FIG. 6b shows current densities (log |J|) against the number of carbon (n in Cn) between different batches, FIG. 6c shows current densities (log |J|) against the number of carbon (n in Cn) for individual gold (Au) lines, and FIG. 6d shows plots of tunneling decay coefficient (β) and current density (log |J|) values as a function of gold (Au) lines.

FIG. 7a shows a diagram of EGaIn electrode pattern of concentric open circles on a PDMS support and the corresponding photograph, FIG. 7b is an optical microscopy image of the EGaIn electrode of FIG. 7a, FIG. 7c shows (i) partially magnified optical microscopy and (ii) SEM images of the corresponding pattern, FIG. 7d is a histogram of current densities (log |J|) obtained from randomly chosen 127 separate junctions at the EGaIn electrode, FIG. 7e shows an optical microscopy image of EGaIn electrode pattern of concentric open rectangles printed on C12 SAM/$Au^{TS}$ and the corresponding histogram of current densities (log |J|), and FIG. 7f shows an optical microscopy image of EGaIn electrode pattern of concentric open triangles printed on C12 SAM/$Au^{TS}$ and the corresponding histogram of current densities (log |J|).

BEST MODE FOR CARRYING OUT THE INVENTION

The objects, specific advantages, and novel features of the present invention will become more apparent from the following detailed description and preferred embodiments, examples of which are illustrated in the accompanying drawings. Although the terms "first", "second", etc. are used herein to describe various components, these components should not be limited by these terms. These terms are only used to distinguish one component from another component. In the description of the present invention, detailed explanations of related art are omitted when it is deemed that they may unnecessarily obscure the essence of the present invention.

A method for fabricating a liquid metal-based electrode according to the present invention includes (S100) preparing a first substrate having a self-assembled monolayer (SAM) arranged on one surface thereof and (S200) printing a liquid metal in a predetermined pattern in contact with the surface of the self-assembled monolayer by using a printing device to form a liquid metal electrode, the printing device including a needle through which the liquid metal is ejected and a controller controlling the movement of the needle.

Briefly, the method of the present invention includes preparing a first substrate (S200) and printing a liquid metal (S200).

In S100, a first substrate having a self-assembled monolayer (SAM) arranged on one surface thereof is prepared. The first substrate may be a glass or polydimethylsiloxane (PDMS) substrate but is not necessarily limited thereto. Materials for substrates and thin films of various electrical/electronic devices may be used without particular limitation for the first substrate. Examples of suitable materials for the first substrate include organic materials, inorganic materials, and organic-inorganic hybrid materials.

The self-assembled monolayer is a monolayer film of surface-active molecules that are spontaneously adsorbed to the surface of a specific substrate to form chemical bonds. The morphology and physical properties of the self-assembled monolayer can be controlled and modified at a single molecular level. The molecules used are divided into three parts: a head group playing an important role in forming the monolayer film by chemical adsorption to the surface of the specific substrate, a hydrocarbon chain assisting in aligning the molecular film by the van der Waals interactions, and a terminal group to which various types of functional groups can be introduced. Functional groups introduced into the SAM serve as important parts that enable various applications of the SAM. A material for the self-assembled monolayer may be, for example, an alkanethiolates, but is not necessarily limited thereto. The self-assembled monolayer may be formed to a thickness of 1 to 4 nm.

The self-assembled monolayer may be directly formed on one surface of the first substrate. Alternatively, the self-assembled monolayer may be formed on the surface of a metal electrode disposed on one surface of the first substrate. The metal electrode may be introduced on the first substrate by a template-stripping process. For example, the metal electrode may be introduced on the first substrate by depositing a metal in a predetermined pattern on one surface of a second substrate to form a thin metal electrode, forming an adhesive layer between the one surface of the second substrate and one surface of a first substrate, and separating the first substrate from the second substrate to transfer the metal electrode to the one surface of the first substrate. Here, the adhesive layer may be formed by dropping or applying an optical adhesive (OA) onto the second substrate on which the metal electrode is disposed, pressing the first substrate thereon, and photocuring the optical adhesive. The adhesive layer may have an intaglio pattern corresponding to the pattern of the transferred metal electrode and may be arranged in contact with the metal electrode on the one surface of the first substrate.

In S200, a liquid metal is printed on the first substrate. The liquid metal is printed in a predetermined pattern by using a printing device. The pattern of the liquid metal is in contact with the surface of the self-assembled monolayer.

The term "liquid metal" refers to a liquid-state metal. An electric current can flow through the first substrate because the liquid metal is electrically conductive. For example, a eutectic gallium-indium (EGaIn) alloy may be used as the liquid metal. Eutectic gallium-indium exhibits liquid properties at room temperature due to its low melting point of about 15.5° C. Eutectic gallium-indium can be easily deformed by an external physical force and restored to its original shape, unlike solid metals such as copper. Accordingly, eutectic gallium-indium has the potential to replace solid metals, particularly in flexible electronic devices. The liquid metal can be printed to form a liquid metal electrode. The liquid metal electrode is composed of the liquid metal only. One or more other materials may optionally be mixed with the liquid metal to improve the electrical and mechanical properties of the liquid metal electrode. The printed liquid metal has a prescribed shape while being in interfacial contact with the first substrate. The shape of the liquid metal may be determined by its own characteristics such as surface tension or may depend on other additives. Alternatively, the liquid metal may be exposed to the atmosphere to form an oxide layer on the surface thereof. The oxide layer maintains the shape of the liquid metal. For example, exposure of EGaIn to air leads to the formation of a $Ga_2O_3$ layer on the EGaIn surface. The oxide layer is resistant to oxidation and allows EGaIn to form and maintain its a prescribed geometry, ultimately resulting in the formation of a microelectrode having a predetermined pattern.

The printing device may include a needle through which the liquid metal is ejected and a controller controlling the movement of the needle. The control over the X, Y, Z axis motions of the needle can diversify the pattern of the liquid metal electrode. The printing device may further include a syringe accommodating the liquid metal and connected to the needle and a syringe pump pressurizing the syringe to eject the liquid metal. The inner diameter of the needle, the pressure of the syringe pump, the standoff distance between the first substrate and the needle, and the velocity of the moving needle affect the uniformity of the pattern of the liquid metal electrode. When the inner diameter of the needle is 80-120 μm and the standoff distance is 2 mm or less, the pressurization of the syringe pump at a pressure of 8.5-9.5 kPa and the movement of the needle at a velocity of 4-6 mm/s for liquid metal printing make the pattern of the liquid metal electrode more uniform and stable.

Conclusively, the method of the present invention enables the manufacture of molecular electronic devices having various shapes and patterns regardless of the type, shape and surface chemical properties of the substrate based on a combination of printed electronics and molecular electronics.

MODE FOR CARRYING OUT THE INVENTION

The present invention will be explained in more detail with reference to the following examples.

Example 1: EGaIn Printing 1.1 Printing Equipment

To directly apply EGaIn microelectrode onto SAM, a partial modification was done to a commercially available dispensing system (NORDSON EFD, E3 Ultimus II) equipped with automatic robot that controls X, Y, Z axis motions by a remote controller. A 32 s gauge, 51 mm length blunt-tip needle affixed to a 3 mL syringe was attached into the dispensing system, and printing was achieved by flowing EGaIn through the syringe needle connected to a moving dispenser at a controlled velocity in a close proximity to a stationary substrate. The flow rate was controlled through a syringe pump while the dispenser mapped out a prescribed geometry.

1.2 Printing of EGaIn Microelectrode on SAM-Bound $Au^{TS}$

FIG. 1a schematically shows direct printing of an EGaIn microelectrode on SAM-bound $Au^{TS}$, FIG. 1b is a photograph of 350 printed molecular junctions corresponding to one $Au^{TS}$ chip, FIG. 1c shows optical microscopy images of the printed molecular junctions of FIG. 1b at different magnification (geometrical contact area ($A_{geo}$) is defined as the area of cross-section between $Au^{TS}$ and EGaIn lines), and FIG. 1d shows scanning electron microscopy (SEM) images of the printed molecular junctions from angles of 90° and 45°.

Forming reliable and reproducible top-contacts on monolayers has been a significant nanotechnological challenge in the field of molecular electronics. This problem has been circumvented by introducing a protective layer at SAM-electrode interface, such as another monolayer chemisorbed on the top electrode, solution-processible conducting polymer, a multilayer graphene film, a compliant conductive oxide layer, and carbon paint, or by using low-melting metals such as lead and gallium, EGaIn and metallic nanoparticles for top-contacts. Most of junction fabrication techniques, particularly for top-contacts, require cumbersome or onerous processes including thermal evaporation, photolithographic patterning, wet-chemical treatment, thermal heating, vacuum suction, or mechanical shaping. In contrast, the present invention provides a simple and convenient approach to print directly a top electrode on the surface of an active layer in a noninvasive fashion.

In this example, eutectic gallium-indium (EGaIn) was printed on SAM-bound $Au^{TS}$ to form microelectrodes. 350 printed junctions per n-alkanethiolate (Cn where n=8, 10, 12, 14) per chip of 2 cm×2 cm $Au^{TS}$ were produced through automated injection of EGaIn microelectrode (see FIG. 1b). Optical microscopy (OM) and scanning electron microscopy (SEM) analysis confirmed that EGaIn microelectrodes were evenly printed without break or droplet formation on $Au^{TS}$/SAM, as shown in FIGS. 1c and 1d.

Example 2: Optimization of Printing

FIG. 2a shows procedures to fabricate template-stripped optical adhesive ($OA^{TS}$) and four parameters (P, ID, h, v) that determine the quality of printing, FIGS. 2b to 2d shows distributions of line width of printed EGaIn microelectrode at various printing conditions (P=2, 5, 10 kPa; v=0.5, 1.0, 2.0, 5.0, 7.0, 10.0 mm/s), FIG. 2e is a histogram of line width of printed EGaIn microelectrode obtained at the optimal printing condition, and FIG. 2f shows photo and optical microscopy images of a pattern of printed EGaIn microelectrode obtained at the optimized printing condition.

The surface of EGaIn is covered with a hydrophilic layer of gallium oxide whereas the surface of SAM is hydrophobic for many cases. Non-adhesion of EGaIn over organic surfaces makes it challenging to print EGaIn microelectrode via a moving dispenser with uniformity and reproducibility. Thus, optical adhesive (OA) was applied to the surface of the substrate used in this example. The OA is composed of organic polymer and yields a hydrophobic surface. In this example, printing condition over template-stripped optical adhesive ($OA^{TS}$) was optimized.

The following four parameters ultimately affect the uniformity of width of printed EGaIn microelectrode: the inner diameter of syringe needle (ID, μm), the pressure (P, kPa) of syringe pump, the standoff distance (h, mm) between a substrate and the needle, and velocity of moving dispenser (v, mm/s) (see FIG. 2a).

The value of ID was fixed by using a commercially available needle (Nordson 32 s gauge; ID=100 μm). The value of h was determined by measuring the thickness of a substrate in three random positions using a micrometer and averaging these values. For $OA^{TS}$, the value of h was ~1.4 mm. While fixing the ID and h values, each of the two remaining parameters, P and v, were varied to find the optimal condition. The values of P and v varied from 2 to 10 kPa and from 0.5 to 10.0 mm/s, respectively.

At each printing condition, the line width of patterned EGaIn microelectrodes was measured by randomly selecting ~80 separate positions and this process was repeated five times for statistical analysis over uniformity of EGaIn microelectrodes. Then, plots of EGaIn line width as a function of P and v were obtained, as shown in FIGS. 2b to 2d.

Most of printing conditions exhibited broad dispersion of line width, along with unmeasurable droplet formation (denoted as ∞; see the inset of FIG. 2b), and blank or broken lines (treated as zero μm for line width in FIG. 2c). The optimal condition under which EGaIn of uniform line width was reproducibly printed was found at P=2 kPa and v=5 mm/s (see the pink-colored box in FIG. 2b). In this condition, the histogram was obtained from which values of mean ($\mu_{EGaIn}$) and standard deviation ($\sigma_{EGaIn}$) were extracted. The histogram exhibited a narrowly distributed normal distribution with $\mu_{EGaIn}$=66.5 μm and $\sigma_{EGaIn}$=4.3 μm (see FIG. 2e). FIG. 2f shows the photo and optical microscopy images for the array of EGaIn microelectrodes printed under the optimized condition.

Example 3: Making of Printed Large-Area Tunnel Junctions

FIG. 3a is a diagram showing an array of printed molecular junctions on $Au^{TS}$ chip, FIG. 3b shows a step-by-step description of making printed large-area tunnel junctions, and FIG. 3c shows the characteristics of $Au^{TS}$ electrodes ((i) and (ii) surface topography (iii) electrical property were analyzed using AFM and tunneling AFM (TUNA) techniques, respectively).

Junctions were formed on independently prepared separate batches and chips. A batch corresponded to 4 in. diameter silicon wafer, which contained eight chips. Each chip had ten $Au^{TS}$ lines. Thirty five EGaIn microelectrodes were sequentially patterned per $Au^{TS}$ line. Therefore, 350 and 2800 junctions were produced per chip and batch, respectively FIG. 3a shows the geometric diagram for printing EGaIn on a chip with a dimension of 2 cm×2 cm. In this example, large-area junctions were designed to have a geometrical junction area ($A_{geo}$) of ~4.9×103 μm². To achieve this desired $A_{geo}$, 70 μm line width was targeted for both top and bottom electrodes. The gaps between EGaIn top-electrodes and between $Au^{TS}$ bottom-electrodes were fixed as 0.5 and 0.8 mm, respectively. A mask with 20 μm line holes was used to deposit ~70 μm width of $Au^{TS}$ line pattern. The mismatch between the mask and the width of $Au^{TS}$ lines was attributed to the oblique incident angle of evaporated gold (Au) with respect to surface of substrate.

Following the procedures in FIG. 3b, printed molecular junctions were constructed. First, gold (Au) microelectrode was patterned on a silicon wafer (step 1). Then, OA was applied to the surface of silicon wafer patterned with the gold (Au) microelectrode (step 2). Subsequently, the resulting surface was covered with a glass substrate (step 3) and photocured with UV for 3 h (step 4). The glass substrate was carefully peeled off from the silicon wafer to yield a $Au^{TS}$ embedded on the OA film (step 5). The resulting $Au^{TS}$ substrate was rinsed with toluene and placed it in a degassed toluene solution containing 3.0 mM n-alkanethiol (Cn where n=8, 10, 12, 14). After 3 h incubation under nitrogen atmosphere, the SAM-bound $Au^{TS}$ chip was rinsed with toluene at least three times and dried in air for a few minutes prior to printing of EGaIn (step 6).

The degree of defects in a SAM is predominantly dictated by the surface roughness of bottom substrate that supports the SAM. To examine the surface topography of the bottom-electrode, $Au^{TS}$ was characterized with atomic force microscopy (AFM) and a tunneling AFM (TUNA). Here, three important features were observed. First, the root-mean-square (rms) surface roughness was 0.5 nm in the scan area of 5×5 μm² (see (i) of FIG. 3c), comparable to conventional large-area $Au^{TS}$. Second, an atomic force micrograph in (ii) of FIG. 3c indicated that the width of $Au^{TS}$ lines was 70±4.0 μm, nearly identical to that of as-deposited gold (Au) lines. Third, an electrically conductive region is constructed in the line width of $Au^{TS}$. The current was measured by applying a DC bias of 3 V to the sample. As shown in (iii) of FIG. 3c, the region of OA confirmed that no current flowed (dark part), and in the gold (Au) region, a current (100 pA) flowed. On the other hand, the AuTS edge did not seal fully with OA, leading to not completely smooth topography at the interface. Given that the tunneling decay coefficient in the junctions was consistent with that of junctions of conventional large-area $Au^{TS}$ substrate, the presence of the microscopic pit at the $Au^{TS}$/OA interface did not considerably affect electrical conductivity. Here, a key finding was that the template-stripping process made little influence on the line width of $Au^{TS}$ microelectrode.

Evaluation Example 1: Analysis of Distribution of $Au^{TS}$ and EGaIn Microelectrode Line Width and Geometrical Contact Area ($A_{geo}$)

FIGS. 4a to 4d are histograms showing distribution of line width (μm) for $Au^{TS}$ on individual alkanethiolates (Cn, n=8, 10, 12, 14), FIG. 4e is a histogram showing combined distribution of line width for $Au^{TS}$, FIGS. 4f to 4i are histograms showing distribution of line width (μm) for EGaIn electrodes formed on individual alkanethiolates (Cn, n=8, 10, 12, 14), FIG. 4j is a histogram showing combined distribution of line width for each EGaIn, FIGS. 4k to 4n are histograms showing geometrical contact area ($A_{geo}$) of junctions on individual alkanethiolates (Cn, n=8, 10, 12, 14), and FIG. 4o is a histogram showing combined geometrical contact area.

The distribution of $A_{geo}$ is reflected into the distribution of current density, J(V), which in turn gauges the reliability of the printing technique to produce uniform tunneling junctions. The distribution of $A_{geo}$ relies predominantly on the uniformity and reproducibility of Au and EGaIn microelectrodes. Histograms of $Au^{TS}$ line width (144-156 randomly selected positions), EGaIn line width (558-700 positions), and $A_{geo}$ of junctions (694-700 junctions) over each n-alkanethiolate were obtained for statistical analysis.

Histograms of SAM-bound $Au^{TS}$ line width (FIGS. 4a-4d) were obtained from which mean value ($\mu_{gold}$) and standard deviation ($\sigma_{gold}$) were determined. Values of $\mu_{gold}$ for each alkanethiolates were 67.2-68.5 μm; considering $\sigma_{gold}$=2.4-4.3, the mean values were indistinguishable from each other and from the mean value (68.1 μm) of the combined all data (see FIG. 4e). The identical statistical analysis was repeated for EGaIn top-electrode. The values of $\mu_{EGaIn}$ for each alkanethiolates were 67.0-72.5 μm (see FIGS. 4f to 4i). Much like $\mu_{gold}$, the values of $\mu_{EGaIn}$ were indistinguishable from each other and from the mean value (71.8 μm) of the combined all data.

The uniformity of $Au^{TS}$ and EGaIn electrodes was well translated into the narrow normal distribution of $A_{geo}$. SAMs of individual alkanethiolates exhibited similar mean values of $A_{geo}$ ($\mu_{Ageo}$), ranging from $4.1 \times 10^3$ to $5.3 \times 10^3$ μm$^2$ (FIGS. 4k-4n). The values of $\sigma_{Ageo}$ ranged from $3.0 \times 10^2$ to $6.0 \times 10^2$ μm$^2$. The values of $\mu_{Ageo}$ for each SAM were indistinguishable from the value of the corresponding combined data ($\mu_{Ageo}$=$4.6 \times 10^3$ μm$^2$) (see FIG. 4o).

Evaluation Example 2: Analysis of Current Density

FIGS. 5a and 5b are histograms showing current densities (log |J|, +0.5 V) for alkanethiolate SAMs (Cn where n=8, 10, 12, 14) measured via different methods (Method I and Method II). FIG. 6a shows current densities (log |J|) against the number of carbon (n in Cn) between the Methods I and II, FIG. 6b shows current densities (log |J|) against the number of carbon (n in Cn) between different batches, FIG. 6c shows current densities (log |J|) against the number of carbon (n in Cn) for individual gold (Au) lines, and FIG. 6d shows plots of tunneling decay coefficient (θ) and current density (log |J|) values as a function of gold (Au) lines.

To evaluate the printing ability of the method according to the present invention and the tunneling performance of the junctions, printed large-area junctions of n-alkanethiolate SAMs were fabricated and length-dependence of tunneling current density (J, A/cm$^2$) was tested. EGaIn microelectrode was directly printed onto SAM-bound $Au^{TS}$ under the optimized condition (P=2 kPa, v=5 mm/s). Printing time per chip was 3-4 min. n-alkanethiolates of different lengths (Cn, where n=8, 10, 12, 14) were incorporated into printed molecular junctions and their tunneling characteristics were evaluated. Value of J (A/cm$^2$) is defined as the quotient of measured current (I, A) and $A_{geo}$ (cm$^2$) (I/$A_{geo}$). A value of J that represents a collection of junctions can be calculated by two options. i) Values of $A_{geo}$ measured on individual junctions using optical microscopy can be used to calculate the corresponding J values (Method I). From the histogram based on these J values, the mean value ($\mu_{log|J|}$) and standard deviation ($\sigma_{log|J|}$) of log |J| are derived. ii) Another possible way to calculate J values is to divide measured values of I with a single value of $A_{geo}$, which is a mean value of $A_{geo}$, assuming that values of $A_{geo}$ are statistically indistinguishable for all junctions (Method II).

FIG. 5 exhibits the histograms of log |J|-V curves obtained from the two methods. Traces of each alkanethiolates SAM ranged from 11280-11880, measured in 564-594 separate junctions in two different chips. Table 1 shows $\mu_{log|J|}$ and log |J| values, and the yield of working junctions determined by the two methods. Importantly, the two methods yielded values that were indistinguishable from each other.

TABLE 1

| | n in $C_n$ | $N_{junctions}$ | $N_{traces}$ | $\mu_{log|J|}$ | $\sigma_{log|J|}$ | Yield (%)[a] |
|---|---|---|---|---|---|---|
| Method I | 8 | 564 | 11280 | −0.1 | 0.4 | 81 |
| | 10 | 570 | 11400 | −0.9 | 0.3 | 81 |
| | 12 | 594 | 11880 | −1.8 | 0.3 | 85 |
| | 14 | 648 | 12960 | −2.5 | 0.5 | 92 |
| Method II | 8 | 564 | 11280 | −0.1 | 0.3 | 81 |
| | 10 | 570 | 11400 | −1.0 | 0.3 | 81 |
| | 12 | 594 | 11880 | −1.8 | 0.3 | 85 |
| | 14 | 648 | 12960 | −2.5 | 0.4 | 92 |

[a]Yield of working junctions.

This finding indicates the reliability and reproducibility of the printed molecular electronics method according to the present invention. Values of $\sigma_{log|J|}$ for all the molecules were ≤0.5 and the yield was >80%. The cant angle of molecule on silver (Ag) (~10°) is higher than that on gold (Au) (~30°) and the SAM on gold (Au) usually shows broader dispersion of J(V) data and lower yield than on silver (Ag). Rectification ratio (r=|J(+V)/|J(−V)|) was nearly unity (r=1.0±1.3) for all the SAMs, indicating little rectification.

The exponential decay of J with molecular length is illustrated by the Simmons model:

$$J = J_0 \times e^{-\beta d}$$

Here, $J_0$ is the charge injection current density (A/cm$^2$); $\beta$ is the tunneling decay coefficient (per carbon; nC$^{-1}$); and d is the width of tunneling barrier (generally the length of molecule).

FIG. 6a exhibits plots of log |J| as a function of the number of alkane chain and compares the length dependence for the Method I and II. The values of β and $J_0$ for the Methods I (β=0.93±0.02 nC$^{-1}$ and $J_0$=$10^{3.1±0.2}$) and II (β=0.95±0.02 nC$^{-1}$, $J_0$=$10^{3.2±0.2}$) were indistinguishable from each other, which verifies the reliability and accuracy of the printed molecular tunnel junctions. For the sake of convenience in processing large amounts of data and statistical analysis, the Method II was used.

Batch-to-batch and electrode-to-electrode variations were evaluated. Two different batches exhibited values of β and log |$J_0$| of 0.94±0.02 nC$^{-1}$ and 3.2±0.2 A/cm$^2$, and 0.93±0.03 nC$^{-1}$ and 3.1±0.3 A/cm$^2$, respectively, which were indistinguishable from each other and from those (0.95±0.02 nC$^{-1}$ and 3.2±0.2 A/cm$^2$) of the corresponding combined data (FIG. 6b). Similarly, there were no differences in length dependence between electrodes.

Evaluation Example 3: Evaluation of Producibility of Different Types of Tunneling Junction Arrays FIG. 7a shows a diagram of EGaIn electrode pattern of concentric open circles on a PDMS support and the corresponding photograph, FIG. 7b is an optical microscopy image of the EGaIn electrode of FIG. 7a, FIG. 7c shows (i)

partially magnified optical microscopy and (ii) SEM images of the corresponding pattern, FIG. 7d is a histogram of current densities (log |J|) obtained from randomly chosen 127 separate junctions at the EGaIn electrode, FIG. 7e shows an optical microscopy image of EGaIn electrode pattern of concentric open rectangles printed on C12 SAM/ $Au^{TS}$ and the corresponding histogram of current densities (log |J|), and FIG. 7f shows an optical microscopy image of EGaIn electrode pattern of concentric open triangles printed on C12 SAM/$Au^{TS}$ and the corresponding histogram of current densities (log |J|).

One of advantages in printed electronics is to produce electrical circuits with arbitrary shapes and patterns. It was tested whether the printed molecular electronics technique of the present invention can be applied to produce other shapes of tunneling junction arrays. The whole batch of Si wafer, which contained 80 $Au^{TS}$ electrode lines, was template-stripped. In this process, a polydimethylsiloxane (PDMS) film of 10 cm diameter and 0.3 mm thick was used rather than glass support for convenient and safe peel off of large-area $Au^{TS}$. As shown in FIG. 7a, EGaIn electrodes were printed to afford a pattern of concentric open circles on C12 SAM-bound $Au^{TS}$. The distance between EGaIn electrodes was fixed as 500 μm; 25 open circles were printed with gradually increasing the radius from 5 to 17 mm under the optimal condition. Printing was performed in a pattern of concentric open circles to evaluate the capability to print curvature geometries with various radii of curvature. Optical microscopy (see FIG. 7b and (i) of FIG. 7c) and SEM (see (ii) of FIG. 7c) images confirmed exquisitely printed circular line geometry of EGaIn electrode with uniformity. Here, 127 junctions were randomly chosen and current density-bias (J-V) traces were measured. The corresponding histogram in FIG. 7d exhibited narrow, single Gaussian distribution of log |J|. The values of mean ($\mu_{log\ |J|}$) and standard deviation ($\sigma_{log\ |J|}$) were −1.7 and 0.4, respectively. These were indistinguishable from those ($\mu_{log\ |J|}$=−1.8, $\sigma_{log\ |J|}$=0.3 in FIG. 5) measured in the line pattern. The printing method of the present invention was also applicable to patterns with sharp edges. As shown in FIGS. 7e and 7f, tunneling junction arrays with concentric open rectangles and triangles were produced on C12 SAM. Values of log |J| for these patterns ($\mu_{log\ |J|}$=−1.7 and −1.7 for rectangles and triangles, respectively) were indistinguishable from those obtained in the other patterns. The yields were >~90%. These results confirmed the universality of the printing method according to the present invention in the context of shape of pattern, without appreciable deterioration of tunneling performances.

Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention.

Such simple modifications and improvements of the present invention belong to the scope of the present invention, and the specific scope of the present invention will be clearly defined by the appended claims.

INDUSTRIAL APPLICABILITY

The present invention enables the formation of an electrode on a monolayer film by liquid metal printing, which is a combination of printed electronics and molecular electronics, and can thus be used to manufacture large quantities of molecular electronic devices with high reproducibility and reliability in a short time through liquid metal dispenser automation technology. Therefore, the present invention is considered industrially applicable.

The invention claimed is:

1. A method for fabricating a liquid metal-based electrode comprising:
    (a) preparing a first substrate having a self-assembled monolayer (SAM) arranged on one surface thereof; and
    (b) printing a liquid metal in a predetermined pattern in contact with a surface of the SAM by using a printing device to form a liquid metal electrode, the printing device comprising a needle through which the liquid metal is ejected and a controller controlling movement of the needle,
    wherein step (a) comprises:
        depositing a metal in a strip form on one surface of a second substrate to form a plurality of thin-film metal electrodes arranged in parallel at predetermined intervals;
        forming an adhesive layer on the one surface of the second substrate and surfaces of the plurality of thin-film metal electrodes;
        adhering the one surface of the second substrate to the one surface of the first substrate and separating the second substrate from the first substrate to transfer the plurality of thin-film metal electrodes and the adhesive layer from the one surface of the second substrate to the one surface of the first substrate; and
        forming the SAM on the surfaces of the plurality of thin-film metal electrodes,
    wherein an adhesive layer strip is formed by a surface of the adhesive layer disposed between each adjacent pair of the plurality of thin-film metal electrodes,
    wherein the liquid metal is printed in a line pattern across the SAM and the adhesive layer strip.

2. The method according to claim 1, wherein the adhesive layer has an intaglio pattern corresponding to the pattern of the transferred plurality of thin-film metal electrodes and the intaglio pattern is transferred to the one surface of the first substrate.

3. The method according to claim 1, wherein the printing device further comprises a syringe accommodating the liquid metal and connected to the needle and a syringe pump pressurizing the syringe to eject the liquid metal.

4. The method according to claim 3, wherein in step (b), the syringe pump operates at a pressure of 8.5 to 9.5 kPa and the needle moves at a velocity of 4 to 6 mm/s to print the liquid metal.

5. The method according to claim 1, wherein the liquid metal is eutectic gallium-indium (EGaIn).

6. The method according to claim 1, wherein the SAM is formed of an alkanethiolate.

* * * * *